US012058850B2

(12) United States Patent
Park et al.

(10) Patent No.: US 12,058,850 B2
(45) Date of Patent: Aug. 6, 2024

(54) SEMICONDUCTOR MEMORY DEVICE AND METHOD OF FABRICATING THE SAME

(71) Applicant: SAMSUNG ELECTRONICS CO., LTD., Suwon-si (KR)

(72) Inventors: Taejin Park, Yongin-si (KR); Hui-Jung Kim, Seongnam-si (KR); Sangho Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 205 days.

(21) Appl. No.: 17/667,652

(22) Filed: Feb. 9, 2022

(65) Prior Publication Data

US 2023/0005924 A1 Jan. 5, 2023

(30) Foreign Application Priority Data

Jul. 2, 2021 (KR) ........................ 10-2021-0087352

(51) Int. Cl.
*H10B 12/00* (2023.01)

(52) U.S. Cl.
CPC ....... *H10B 12/315* (2023.02); *H10B 12/0335* (2023.02); *H10B 12/053* (2023.02); *H10B 12/34* (2023.02); *H10B 12/482* (2023.02)

(58) Field of Classification Search
None
See application file for complete search history.

(56) References Cited

U.S. PATENT DOCUMENTS

| | | | |
|---|---|---|---|
| 6,214,688 B1 | 4/2001 | Hwang et al. | |
| 10,204,910 B2 | 2/2019 | Kim et al. | |
| 10,468,350 B2 | 11/2019 | Kim et al. | |
| 2013/0256828 A1 | 10/2013 | Lee et al. | |
| 2013/0292847 A1 | 11/2013 | Choi et al. | |
| 2016/0064384 A1 | 3/2016 | Park et al. | |
| 2018/0247943 A1 | 8/2018 | Feng et al. | |
| 2018/0301335 A1 | 10/2018 | Tapily et al. | |
| 2018/0342521 A1 | 11/2018 | Son et al. | |
| 2020/0365537 A1* | 11/2020 | Choi .................... | H10B 12/053 |
| 2021/0082924 A1 | 3/2021 | Seong et al. | |
| 2021/0098460 A1 | 4/2021 | Lee et al. | |
| 2021/0143158 A1 | 5/2021 | Ha et al. | |

FOREIGN PATENT DOCUMENTS

| | | |
|---|---|---|
| CN | 107706179 A | 2/2018 |
| CN | 108206208 A | 6/2018 |
| CN | 109962052 A | 7/2019 |

(Continued)

*Primary Examiner* — Steven M Christopher
(74) *Attorney, Agent, or Firm* — Muir Patent Law, PLLC

(57) ABSTRACT

A semiconductor memory device includes active regions including first impurity regions and second impurity regions, word lines on the active regions and extended in a first direction, bit lines on the word lines and extended in a second direction crossing the first direction, the bit lines being connected to the first impurity regions, first contact plugs between the bit lines, the first contact plugs being connected to the second impurity regions, landing pads on the first contact plugs, respectively, and gap-fill structures filling spaces between the landing pads, top surfaces of the gap-fill structures being higher than top surfaces of the landing pads.

20 Claims, 24 Drawing Sheets

(56) References Cited

FOREIGN PATENT DOCUMENTS

| | | | |
|---|---|---|---|
| KR | 10-0270211 | B1 | 10/2000 |
| KR | 10-1883656 | B1 | 7/2018 |
| KR | 10-2018-0115234 | A | 10/2018 |
| KR | 10-2154188 | B1 | 9/2020 |
| KR | 10-2021-0032906 | A | 3/2021 |
| KR | 10-2021-0037211 | A | 4/2021 |

* cited by examiner

SEMICONDUCTOR MEMORY DEVICE AND METHOD OF FABRICATING THE SAME

CROSS-REFERENCE TO RELATED APPLICATION

This U.S. non-provisional patent application claims priority under 35 U.S.C. § 119 to Korean Patent Application No. 10-2021-0087352, filed on Jul. 2, 2021, in the Korean Intellectual Property Office, the entire contents of which are hereby incorporated by reference.

BACKGROUND

1. Field

The present disclosure relates to a semiconductor, and in particular, to a semiconductor memory device and a method of fabricating the same.

2. Description of the Related Art

Due to their small-size, multifunctionality, and/or low-cost characteristics, semiconductor memory devices are being esteemed as important elements in the electronic industry. With the advancement of the electronic industry, there is an increasing demand for a highly-integrated semiconductor memory device. To increase the integration density of the semiconductor memory device, it is necessary to reduce linewidths of patterns constituting the semiconductor memory device.

SUMMARY

According to an embodiment, a semiconductor memory device may include active regions including first impurity regions and second impurity regions, word lines provided on the active regions and extended in a first direction, bit lines provided on the word lines, extended in a second direction crossing the first direction, and connected to the first impurity regions, first contact plugs provided between the bit lines and connected to the second impurity regions, respectively, landing pads provided on the first contact plugs, respectively, and a gap-fill structure filling a space between the landing pads. A top surface of the gap-fill structure may be higher than top surfaces of the landing pads.

According to an embodiment, a semiconductor memory device may include active regions including first impurity regions and second impurity regions, word lines provided on the active regions and extended in a first direction, bit lines provided on the word lines, extended in a second direction crossing the first direction, and connected to the first impurity regions, first contact plugs provided between the bit lines and connected to the second impurity regions, respectively, landing pads provided on the first contact plugs, respectively, and a gap-fill structure filling a space between the landing pads. The gap-fill structure may include a first portion between the landing pads and a second portion protruding from top surfaces of the landing pads. The first portion may have a decreasing width in a downward direction, and the second portion may have a decreasing width in an upward direction.

According to an embodiment, a semiconductor memory device may include word lines buried in an upper portion of a substrate and extended in a first direction, active regions defined in an upper portion of the substrate by a device isolation layer, the active regions including first impurity regions and second impurity regions, which are spaced apart from each other with the word lines interposed therebetween, bit lines provided on the substrate, extended in a second direction crossing the first direction, and connected to the first impurity regions, first contact plugs connected to the second impurity regions, second contact plugs connecting the first impurity regions to the bit lines, landing pads on the first contact plugs, a gap-fill structure filling a space between the landing pads, and a capacitor connected to the second impurity regions through the first contact plugs and the landing pads. The capacitor may include bottom electrodes, a dielectric layer, and a top electrode. Each of the bit lines may include a semiconductor pattern, an ohmic pattern, and a metal-containing pattern. A top surface of the gap-fill structure may be higher than top surfaces of the landing pads.

According to an embodiment, a method of fabricating a semiconductor memory device may include forming a device isolation layer in a substrate to define active regions, forming word lines to cross the active regions, forming bit lines on the word lines, forming first contacts, which are connected to the active regions, between the bit lines, forming landing pads on the first contacts, forming a gap-fill structure to fill a space between the landing pads, forming a mold layer to cover the gap-fill structure and the landing pads, forming electrode holes to penetrate the mold layer, and forming bottom electrodes in the electrode holes. The forming of the gap-fill structure may include forming a first layer to fill the space between the landing pads, forming a first portion of the gap-fill structure from the first layer by performing a planarization process to expose the landing pads, and forming a second portion of the gap-fill structure by performing a selective deposition process using the first portion as a seed layer. The electrode holes may be formed to expose the second portion of the gap-fill structure.

According to an embodiment, a method of fabricating a semiconductor memory device may include forming a device isolation layer in a substrate to define active regions, forming word lines to cross the active regions, forming bit lines on the word lines, forming first contacts, which are connected to the active regions, between the bit lines, forming a landing pad layer to cover the first contacts and the bit lines, forming mask patterns on the landing pad layer, patterning the landing pad layer using the mask patterns to form landing pads, forming a gap-fill structure to fill a space between the landing pads, and removing the mask patterns. The forming of the gap-fill structure may include forming a first layer to fill a space between the landing pads. The first layer may be formed to have a top surface higher than top surfaces of the landing pads. A portion of the first layer may be removed when the mask patterns are removed.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
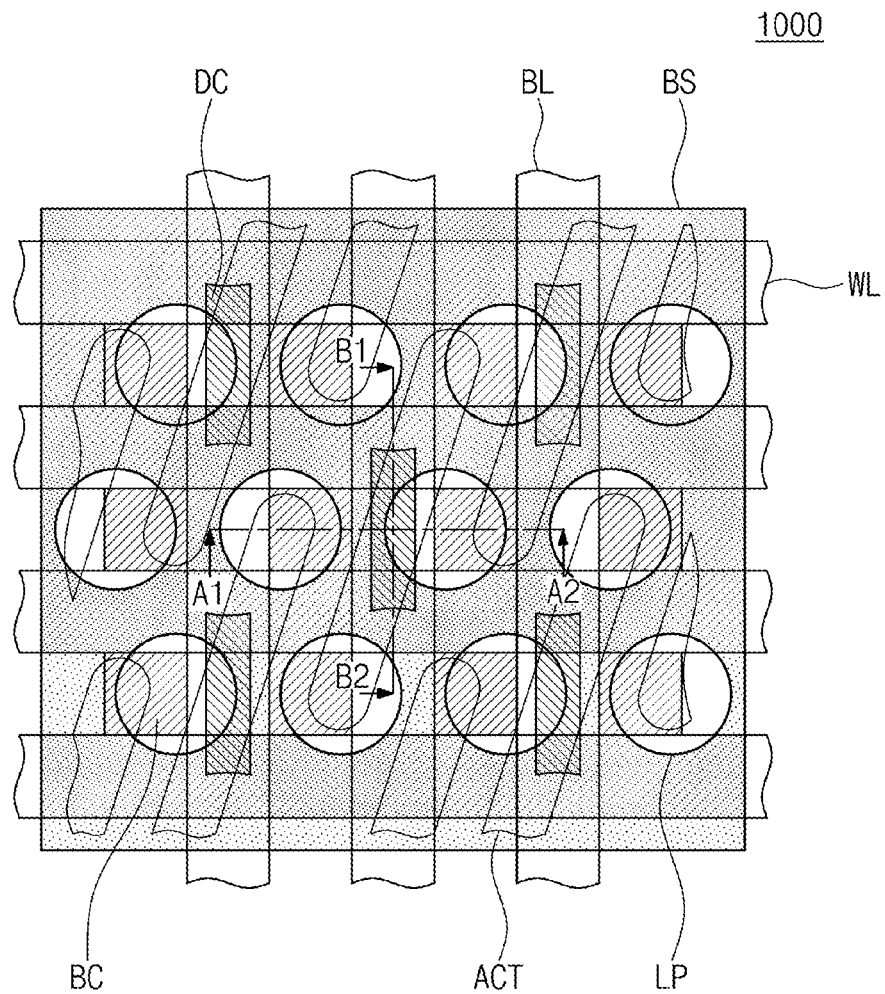
FIG. 1 is a plan view illustrating a semiconductor memory device according to an embodiment.
Figure 2:
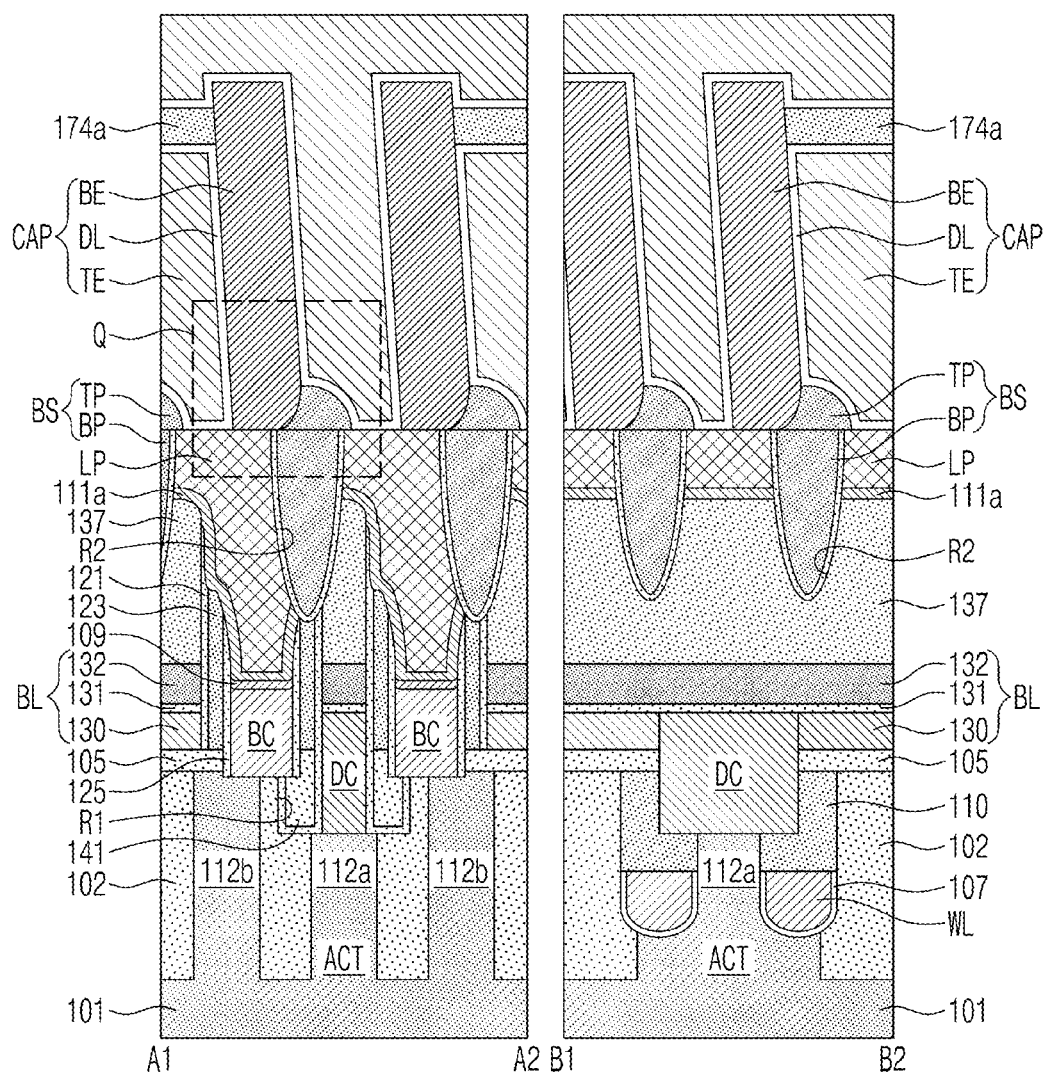
FIG. 2 is a cross-sectional view along lines A1-A2 and B1-B2 of FIG. 1.
Figure 3:
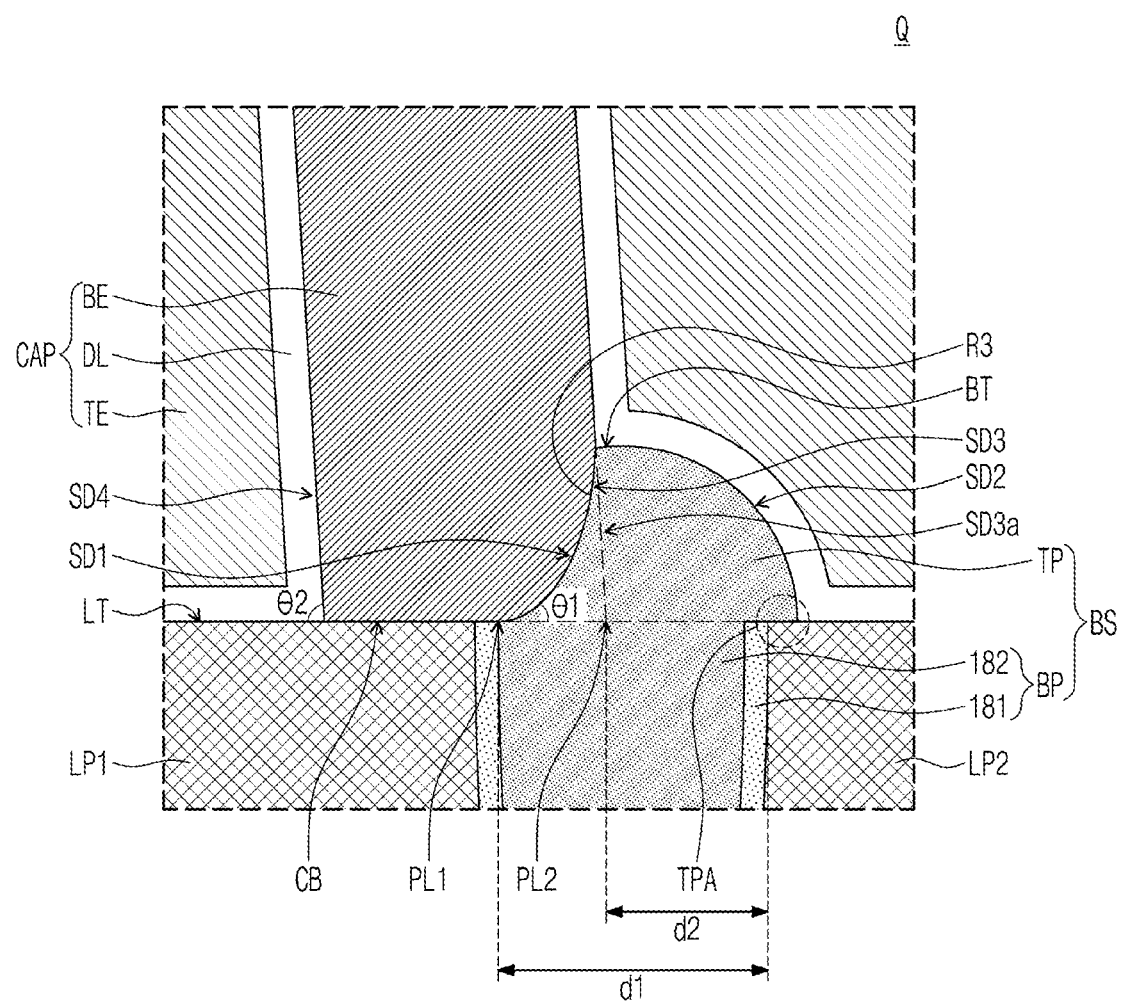
FIG. 3 is an enlarged cross-sectional view of portion 'Q' of FIG. 2.

FIG. 1 is a plan view illustrating a semiconductor memory device 1000 according to an embodiment. FIG. 2 is a cross-sectional view along lines A1-A2 and B1-B2 of FIG. 1. FIG. 3 is an enlarged cross-sectional view of portion 'Q' of FIG. 2.

Referring to FIGS. 1 and 2, a device isolation pattern 102 may be disposed in a substrate 101 to define active portions ACT. The substrate 101 may be a semiconductor substrate (e.g., a single crystalline silicon wafer). Each of the active portions ACT may have an isolated shape. When viewed in a plan view, each of the active portions ACT may be a bar-shaped pattern elongated in a third direction D3. When viewed in a plan view, the active portions ACT may correspond to portions of the substrate 101 enclosed by the device isolation pattern 102. The active portions ACT may be arranged in the third direction D3 to be parallel to each other, and each of the active portion ACT may be arranged such that an end portion thereof is located near a center of another of the active portions ACT adjacent thereto.

Word lines WL may be provided to cross the active portions ACT. The word lines WL may be respectively disposed in grooves which are formed in the device isolation pattern 102 and the active portions ACT. The word lines WL may be parallel to a first direction D1 crossing the third direction D3. The word lines WL may be formed of or include at least one conductive material. A gate dielectric layer 107 may be disposed between the word line WL and an inner surface of the groove. The gate dielectric layer 107 may be formed of or include at least one of, e.g., thermally-grown oxide, silicon nitride, silicon oxynitride, and high-k dielectric materials. Each of the active portions ACT may be provided to cross a pair of the word lines WL.

A first impurity region 112a may be provided in a portion of each of the active portions ACT between the pair of the word lines WL, and a pair of second impurity regions 112b may be provided in opposite edge regions of each of the active portion ACT. The first and second impurity regions 112a and 112b may be doped with n-type impurities. The first impurity region 112a may correspond to a common drain region, and the second impurity region 112b may correspond to a source region. Each of the word lines WL and the first and second impurity regions 112a and 112b adjacent thereto may constitute a transistor.

Top surfaces of the word lines WL may be lower than top surfaces of the active portions ACT. A word line capping pattern 110 may be disposed on each word line WL. The word line capping pattern 110 may be a line-shaped pattern, which is extended in a length direction of the word line WL, and may cover the top surface of the word line WL. The word line capping pattern 110 may be formed of or include at least one of, e.g., silicon nitride or silicon oxide.

An interlayer insulating pattern 105 may be disposed on the substrate 101. The interlayer insulating pattern 105 may be formed of or include at least one of, e.g., silicon oxide, silicon nitride, or silicon oxynitride and may have a single- or multi-layered structure. The interlayer insulating patterns 105 may be spaced apart from each other, when viewed in a plan view. The interlayer insulating pattern 105 may cover end portions of adjacent two of the active portions ACT.

First recess regions R1, which are formed by partially recessing upper portions of the substrate 101, the device isolation pattern 102, and the word line capping pattern 110, may be provided. Bit lines BL may be disposed on the interlayer insulating pattern 105. The bit lines BL may be provided to cross the word line capping patterns 110 and the word lines WL. As shown in FIG. 1, the bit lines BL may be extended in a second direction D2 crossing the first and third directions D1 and D3 and may be connected to the first impurity regions 112a. The bit lines BL may include a semiconductor pattern 130, an ohmic pattern 131, and a metal-containing pattern 132, which are sequentially stacked. The semiconductor pattern 130 may be formed of or include doped or undoped polysilicon. The ohmic pattern 131 may be formed of or include at least one metal silicide. The metal-containing pattern 132 may be formed of or include at least one of a metallic material (e.g., tungsten, titanium, tantalum, and so forth) and a conductive metal nitride (e.g., titanium nitride, tantalum nitride, tungsten nitride). Layers constituting the bit lines BL and materials thereof are not limited to this example. Bit line capping patterns 137 may be disposed on the bit lines BL, respectively. The bit line capping patterns 137 may be formed of or include an insulating material (e.g., silicon nitride).

First contact plugs DC may be disposed in the first recess regions R1 overlapping, e.g., in parallel to, the bit lines BL, e.g., the first contact plugs DC may be perpendicular to and intersect the word lines WL. The first contact plugs DC may be formed of or include, e.g., doped or undoped polysilicon. The first contact plugs DC may be electrically connected to the first impurity regions 112a, respectively. Each of the bit lines BL may be electrically connected to the first impurity regions 112a by the first contact plugs DC.

An insulating gapfill pattern 141 may fill a remaining portion of the first recess region R1 which is not occupied by the first contact plug DC. The insulating gapfill pattern 141 may be formed of or include at least one of, e.g., silicon oxide, silicon nitride, or silicon oxynitride, and may have a single- or multi-layered structure.

Second contact plugs BC may be disposed between an adjacent pair of the bit lines BL. As shown in FIG. 1, the second contact plugs BC may be two-dimensionally arranged to be spaced apart from each other. The second contact plugs BC may be formed of or include at least one of, e.g., doped or undoped polysilicon or metallic materials.

A first spacer 121, a second spacer 123, and a third spacer 125 may be sequentially provide on side surfaces of the bit lines BL. The first to third spacers 121, 123, and 125 may be provided between the bit lines BL and the second contact plugs BC. The first spacer 121 may cover the side surface of the bit line BL and a side surface of the bit line capping pattern 137. The first spacer 121 may be extended to cover a side surface of the first contact plug DC and side and bottom surfaces of the first recess region R1. The third spacer 125 may cover side surfaces of the second contact plugs BC. A lower portion of the third spacer 125 may be in contact with the interlayer insulating pattern 105. The second spacer 123 may be provided between the first spacer 121 and the third spacer 125. In an embodiment, the first spacer 121 and the third spacer 125 may be formed of or include the same material, and the second spacer 123 may be formed of or include a material different from the first spacer 121 and the third spacer 125. For example, the first spacer 121 and the third spacer 125 may be formed of or include silicon nitride, and the second spacer 123 may be formed of or include silicon oxide and/or silicon oxynitride. In an embodiment, an air gap may be provided, instead of the second spacer 123.

Ohmic layers 109 may be disposed on the second contact plugs BC. The ohmic layers 109 may be formed of or include, e.g., metal silicide. The ohmic layers 109, the first to third spacers 121, 123, and 125, and the bit line capping pattern 137 may be covered with a diffusion prevention pattern 111a. The diffusion prevention pattern 111a may be formed of or include at least one of metal nitrides (e.g., titanium nitride and tantalum nitride). Landing pads LP may be disposed on the diffusion prevention patterns 111a, respectively. The landing pads LP may be formed of or include a metal-containing material (e.g., tungsten). The landing pads LP may be electrically connected to the second contact plugs BC, respectively. An upper portion of the landing pad LP may cover a top surface of the bit line capping pattern 137 and may have a width larger than the second contact plug BC. A center of the landing pad LP may be shifted, e.g., offset, from a center of the second contact plug BC in the first direction D1, as shown in FIG. 1. Portions of each of the bit lines BL may be vertically overlapped with the landing pads LP.

A gap-fill structure BS may be provided to fill a space between the landing pads LP. The gap-fill structure BS may be provided in a second recess region R2, which is defined by side surfaces of the landing pads LP and side surfaces of the bit line capping patterns 137. When viewed in a plan view, the gap-fill structure BS may have a shape filling the space between the landing pads LP, which are two-dimensionally spaced apart from each other. As an example, a planar shape of the gap-fill structure BS may be a mesh shape including holes which are pierces by the landing pads LP, e.g., a top surface of the gap-fill structure BS may have a continuous shape with two-dimensionally arranged openings therethrough (FIG. 1). The gap-fill structure BS will be described in more detail with reference to FIG. 3.

Bottom electrodes BE may be disposed on the landing pads LP, respectively. As an example, the bottom electrode BE may be formed of or include at least one of doped poly-silicon, metal nitrides (e.g., titanium nitride), or metallic materials (e.g., tungsten, aluminum, and copper). The bottom electrode BE may have a shape of a circular pillar, a hollow cylinder, or a cup.

A dielectric layer DL may be provided to cover top and side surfaces of the bottom electrodes BE. The dielectric layer DL may be extended to regions on top surfaces of the landing pads LP and a top surface of the gap-fill structure BS. The dielectric layer DL may be covered with a top electrode TE. An interface layer may be provided between the dielectric layer DL and the bottom electrodes BE. The dielectric layer DL may be a metal oxide layer which contains at least one of, e.g., hafnium (Hf), niobium (Nb), titanium (Ti), tantalum (Ta), zirconium (Zr), chromium (Cr), cobalt (Co), iridium (Ir), molybdenum (Mo), osmium (Os), rhenium (Ra), rhodium (Rh), ruthenium (Ru), tungsten (W), or vanadium (V).

The top electrode TE may be formed of or include at least one of doped poly-silicon, doped silicon-germanium, metal nitrides (e.g., titanium nitride), or metallic materials (e.g., tungsten, aluminum, and copper). The bottom electrodes BE, the dielectric layer DL, and the top electrode TE may constitute a capacitor CAP. Accordingly, the semiconductor memory device 1000 including the capacitor CAP may be provided.

Referring to FIG. 3, a top surface BT of the gap-fill structure BS may be higher than top surfaces LT of the landing pads LP. In an embodiment, the gap-fill structure BS may include a first portion BP, which is provided to fill a space between the landing pads LP, and a second portion TP, which protrudes from, e.g., above, the top surfaces LT of the landing pads LP in a direction opposite to the substrate 101, e.g., the entire top surface BT of the gap-fill structure BS may be above the top surfaces LT of the landing pads relative to the substrate 101.

As an example, the first portion BP of the gap-fill structure BS may include a first insulating layer 181 and a second insulating layer 182, which sequentially cover the second recess region R2 between adjacent ones of the landing pads (e.g., between a first landing pad LP1 and a second landing pad LP2 in FIG. 3). For example, the first insulating layer 181 and the second insulating layer 182 may be formed of or include different materials from each other. In this case, the first insulating layer 181 may be one of a silicon nitride layer or a silicon oxynitride layer, and the second insulating layer 182 may be the other of the silicon nitride layer or the silicon oxynitride layer. In another example, both of the first and second insulating layers 181 and 182 may be formed of or include silicon nitride and may have, e.g., exhibit, different material properties from each other. In this case, the first insulating layer 181 may have a step coverage that is larger than that of the second insulating layer 182 and/or the second insulating layer 182 may have a density smaller than that of the first insulating layer 181. In yet another example, the first insulating layer 181 may be omitted, and the second insulating layer 182 may be in direct contact with the landing pads LP. The top surfaces LT of the landing pads LP may be in contact with bottom surfaces CB of the bottom electrodes BE, respectively.

For example, the second portion TP of the gap-fill structure BS may be formed of or include the same material as the first portion BP. For example, the second portion TP of the gap-fill structure BS may be formed of or include silicon nitride. For example, the second portion TP of the gap-fill structure BS may include a silicon nitride layer which has an etch resistance better than that of the first portion BP of the gap-fill structure BS. The second portion TP of the gap-fill structure BS may have a density that is higher than that of the first portion BP of the gap-fill structure BS, i.e., a material of the second portion TP has a higher density than a material of the first portion BP.

In another example, the second portion TP of the gap-fill structure BS may include an insulating layer which is formed of a material different from the first portion BP. In an embodiment, the second portion TP of the gap-fill structure BS may be formed of or include at least one of silicon oxynitride, silicon carbon nitride, or silicon nitride. An interface may be provided between the first and second portions BP and TP of the gap-fill structure BS, but in an embodiment, such an interface may not be provided. When measured in a direction perpendicular to a top surface of the substrate 101, a thickness of the second portion TP of the gap-fill structure BS may be smaller than a thickness of the first portion BP. As an example, the thickness of the second portion TP of the gap-fill structure BS may be about 10% to about 50% of the thickness of the first portion BP. For example, if an imaginary interface between the first portion BP and the second portion TP is at a same height level as the top surface LT of the landing pads LP (i.e., the dashed line in FIG. 3), the thickness of the second portion TP may be measured from such an imaginary interface to a topmost point on the top surface BT of the second portion TP, and the thickness of the first portion BP may be measured from such an imaginary interface to a bottommost point of the first portion BP.

The second portion TP of the gap-fill structure BS may include a first side surface SD1, which is, e.g., directly, connected to the bottom electrode BE, and a second side surface SD2, which is opposite to the first side surface SD1. The first side surface SD1 may include a third recess region R3 which is a concavely recessed region, e.g., curved inwardly with respect to the second portion TP. A lower portion of the bottom electrode BE may be in, e.g., direct, contact with the first side surface SD1, in the third recess region R3. In more detail, a third side surface SD3, which is a side surface of a lower portion of the bottom electrode BE, may be convexly rounded, e.g., curved outwardly with respect to the bottom electrode BE, along the third recess region R3 and may be in, e.g., direct, contact with the first side surface SD1, e.g., the third side surface SD3 and the first side surface SD1 may have complementary shapes with respect to each other. A fourth side surface SD4 of the bottom electrode BE, which is opposite to the third side surface SD3, may be connected to, e.g., in direct contact with, the top surface LT of the first landing pad LP1, and may not be connected to the second portion TP of the gap-fill structure BS, unlike the third side surface SD3.

The fourth side surface SD4 of the bottom electrode BE may have a second inclination angle θ2 relative to the top surface LT of the landing pad LP, and the third side surface SD3 of the bottom electrode BE may have a first inclination angle θ1, which is smaller than the second inclination angle θ2, relative to the top surface LT of the landing pad LP. The first portion BP of the gap-fill structure BS may have a decreasing width, e.g., along a direction parallel to the top surface LT of the landing pad LP, in a downward direction, and the second portion TP of the gap-fill structure BS may have a decreasing width in an upward direction. In other words, as illustrated in FIG. 2, the width of first portion BP of the gap-fill structure BS may decrease, as a distance from the bit line BL decreases, and the width of the second portion TP of the gap-fill structure BS may decrease, as a distance from the bit line BL increases, i.e., widths of the first and second portions BP and TP decrease in opposite directions. A lower width of the second portion TP of the gap-fill structure BS may be larger than an upper width of the first portion BP, e.g., the lower portion of the second portion TP may extend beyond and overhang the upper portion of the first portion BP. The second portion TP of the gap-fill structure BS may include a protruding portion TPA which is extended to cover, e.g., a portion of, a top surface of the second landing pad LP2 adjacent thereto. The second portion TP of the gap-fill structure BS may be formed by a selective growth process and/or a selective deposition process using the first portion BP as a seed layer, as will be described in a fabrication method below, and in this case, a cross-section of the second portion TP of the gap-fill structure BS may have a semi-circular shape.

As shown in FIGS. 2 and 3, a center axis of the bottom electrode BE may not be parallel to a direction perpendicular to the top surface of the substrate 101, e.g., the bottom electrode BE may be tilted at an oblique angle with respect to the substrate 101. This is because electrode hole EH (e.g., see FIG. 14) serving as a mold of the bottom electrode BE is formed to have a high aspect ratio. In addition, due to a misalignment issue in a fabrication process, a lower portion of the bottom electrode BE may be offset from a center of the top surface LT of the landing pad LP and may cover a portion of the gap-fill structure BS, as shown in FIGS. 2 and 3. In this case, if the gap-fill structure BS did not include the second portion TP (e.g., if a topmost surface of a gap-fill structure were to be coplanar with the top surface of a landing pad), a distance from the third side surface SD3a of the bottom electrode BE (which would be connected to the gap-fill structure BS without the second portion TP) or from a second position PL2 (which is in contact with the gap-fill structure BS) to the second landing pad LP2 would have been smaller than distance d2 illustrated in FIG. 3 (e.g., a distance between the bottom electrode and an adjacent landing pad would have been too small due to lack of the second portion TP). This could have caused an increase in leakage current between the bottom electrode BE, which is connected to the first landing pad LP1, and the second landing pad LP2 adjacent thereto, thereby causing a short, i.e., an electrical connection between the first and second landing pads LP1 and LP2 via the bottom electrode BE.

In contrast, according to an embodiment, the second portion TP of the gap-fill structure BS may be formed on top of the first portion BP to contact the first side surface SD1 of the bottom electrode BE, thereby preventing the gap-fill structure BS from being over-etched during the process of forming the electrode hole EH (e.g., see FIG. 14) serving as the mold of the bottom electrode BE. Further, even when the bottom electrode BE is misaligned, the second portion TP of the gap-fill structure BS may maintain a sufficient distance between the bottom electrode BE and the second landing pad LP2 to a distance d1. In other words, the distance d1 from the second landing pad LP2 to a first position PL1, at which the bottom surface CB of the bottom electrode BE is in contact with the gap-fill structure BS, may be larger than the distance d2 in the case that the second portion TP of the gap-fill structure BS is absent. Accordingly, it may be possible to prevent an unintended electrical connection (i.e., a bridge phenomenon) between the bottom electrode BE connected to the first landing pad LP1 and the second landing pad LP2 adjacent thereto.

FIGS. 4 to 17 are cross-sectional views along lines A1-A2 and B1-B2 of FIG. 1 illustrating stages in a method of fabricating a semiconductor memory device according to an embodiment.

Figure 4:
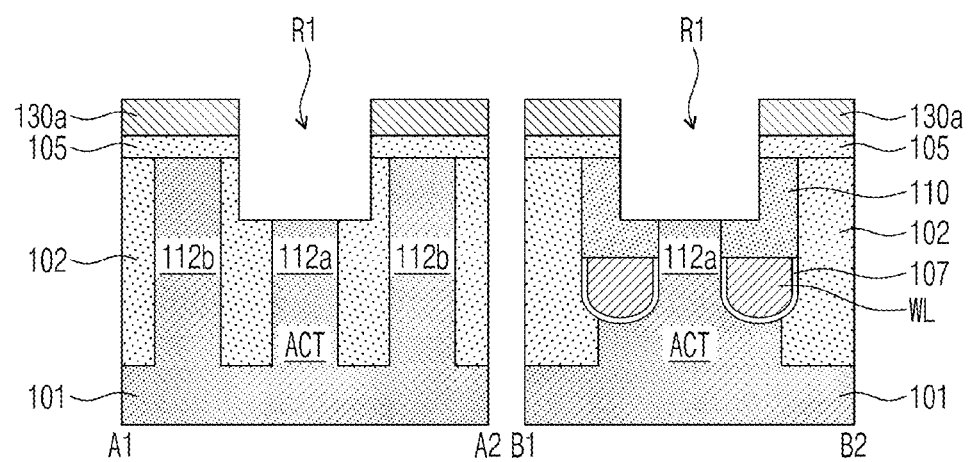
FIGS. 4 to 17 are cross-sectional views along lines A1-A2 and B1-B2 of FIG. 1 illustrating stages in a method of fabricating a semiconductor memory device according to an embodiment.

Referring to FIGS. 1 and 4, the device isolation patterns 102 may be formed in the substrate 101 to define the active portions ACT. As an example, grooves may be formed in the substrate 101, and the device isolation patterns 102 may be formed by filling the grooves with an insulating material. Trenches may be formed by etching the active portions ACT and the device isolation pattern 102. The word lines WL may be formed in the trenches, respectively. A pair of the word lines WL may be formed to cross each of the active portions ACT. Before the formation of the word lines WL, the gate dielectric layer 107 may be formed on an inner surface of each of the trenches. The gate dielectric layer 107 may be formed by, e.g., a thermal oxidation process, a chemical vapor deposition process, and/or an atomic layer deposition process. The word lines WL may be formed in the trenches by depositing a conductive layer on the substrate 101 to fill the trenches and performing an etch-back or chemical-mechanical polishing process on the conductive layer. The word lines WL may be recessed to have top surfaces that are lower than top surfaces of the active portions ACT. An insulating layer (e.g., a silicon nitride layer) may be formed on the substrate 101 to fill the trenches, e.g., above the word lines WL, and then may be planarized to form the word line capping patterns 110 on the word lines WL, respectively.

Impurities may be injected into the active portions ACT using the word line capping patterns 110 and the device isolation pattern 102 as a mask. Accordingly, the first and second impurity regions 112a and 112b may be formed in the active portions ACT. The first and second impurity regions 112a and 112b may have a different conductivity type from the substrate 101. For example, in the case where the substrate 101 is of a p-type, each of the first and second impurity regions 112a and 112b may be of an n-type.

The interlayer insulating pattern 105 and a first mask pattern 130a may be formed on the substrate 101. In an embodiment, an insulating layer and a poly-silicon layer may be sequentially formed on the substrate 101. Thereafter, the first mask pattern 130a may be formed by patterning the poly-silicon layer. The first recess regions R1 and the interlayer insulating pattern 105 may be formed by etching the insulating layer, the device isolation pattern 102, the substrate 101, and the word line capping patterns 110 using the first mask pattern 130a as an etch mask. The first recess regions R1 may be formed to expose the first impurity regions 112a.

Figure 5:
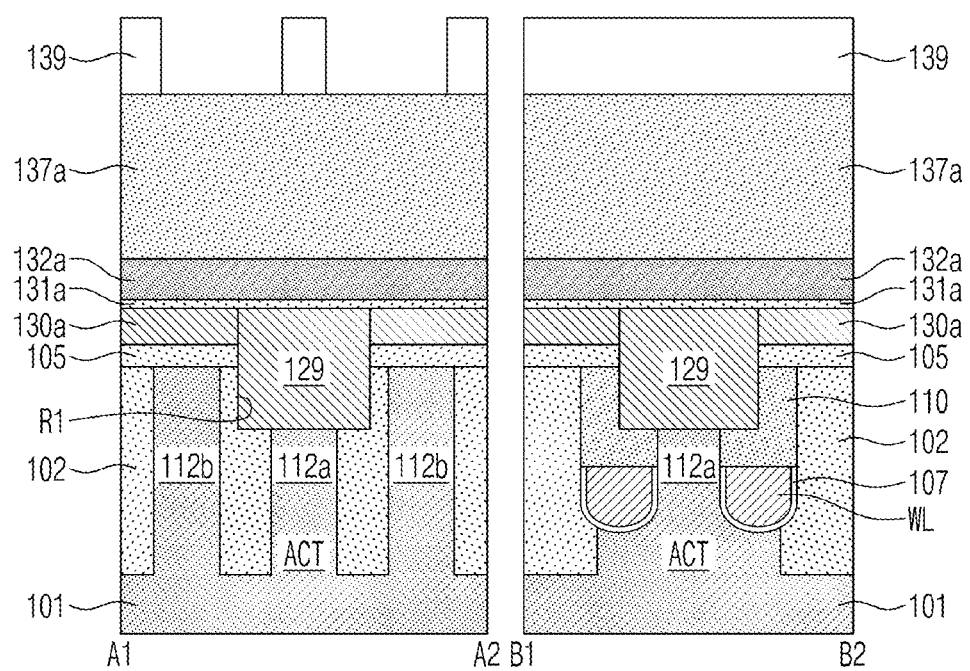

Referring to FIGS. 1 and 5, conductive patterns 129 may be formed to fill the first recess regions R1. As an example, the conductive patterns 129 may be formed of or include polysilicon material. Thereafter, a planarization process may be performed.

An ohmic layer 131a, a metal-containing layer 132a, and a capping layer 137a may be sequentially formed on the first mask pattern 130a and the conductive patterns 129. The ohmic layer 131a may be formed of a metal silicide (e.g., cobalt silicide). The ohmic layer 131a may be formed by depositing a metal layer on the first mask pattern 130a and the conductive patterns 129, and performing a thermal treatment process. The thermal treatment process may be performed to react the metal layer with the first mask pattern 130a and the conductive patterns 129 and thereby to form a metal silicide. An unreacted portion of the metal layer may be removed. The metal-containing layer 132a may be formed of or include at least one of metallic materials (e.g., tungsten, titanium, and tantalum) or conductive metal nitrides (e.g., titanium nitride, tantalum nitride, tungsten nitride). The capping layer 137a may be formed of or include at least one of insulating materials (e.g., silicon nitride).

Second mask patterns 139 may be formed on the capping layer 137a to define planar shapes of bit lines BL to be described below. The second mask patterns 139 may be extended in the second direction D2 shown in FIG. 1. In an embodiment, the second mask patterns 139 may be formed of or include at least one of, e.g., amorphous carbon, silicon nitride, or metallic materials.

Figure 6:
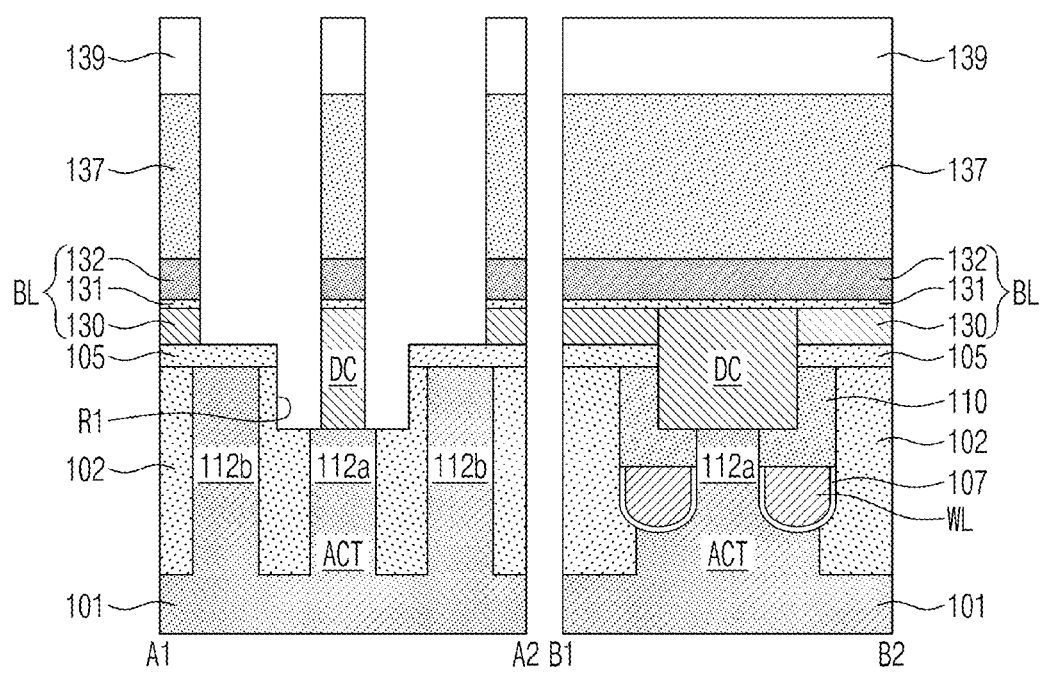

Referring to FIGS. 1 and 6, the bit lines BL, the first contact plugs DC, and the bit line capping patterns 137 may be formed by sequentially etching the capping layer 137a, the metal-containing layer 132a, the ohmic layer 131a, the first mask pattern 130a, and the conductive patterns 129 using the second mask patterns 139 as an etch mask. Each of the bit lines BL may include the semiconductor pattern 130, the ohmic pattern 131, and the metal-containing pattern 132. The etching process may be performed to partially expose a top surface of the interlayer insulating pattern 105 and an inner side surface and a bottom surface of the first recess region R1.

Figure 7:
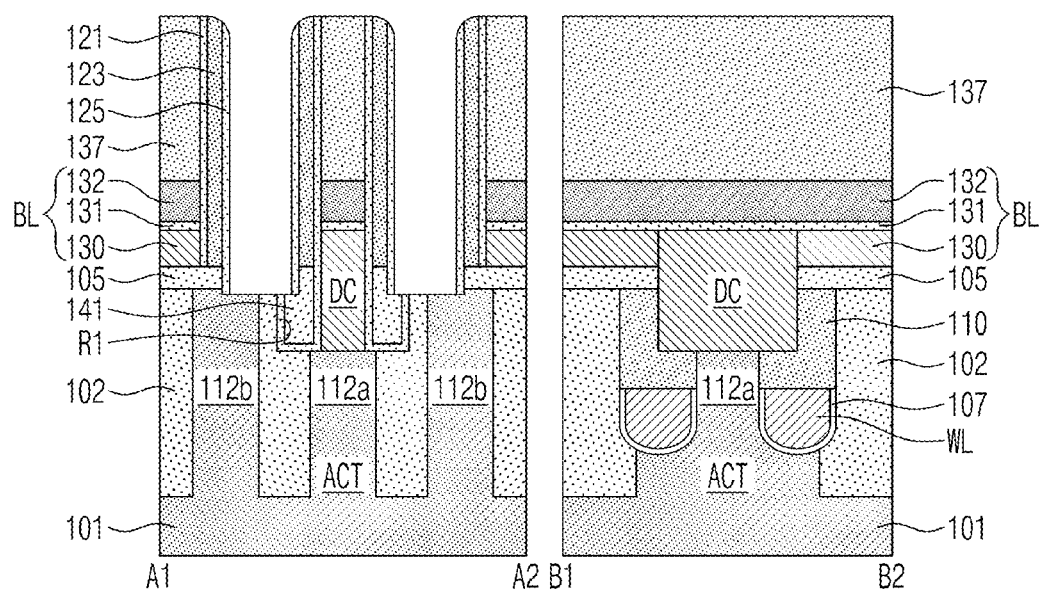

Referring to FIGS. 1 and 7, after the removal of the second mask patterns 139, the first spacer 121, the second spacer 123, and the third spacer 125 may be formed on each of the side surfaces of the bit lines BL. The first spacer 121 may conformally cover a bottom surface and an inner side surface of the first recess region R1. The first spacer 121 may be formed of or include, e.g., silicon nitride. An insulating layer (e.g., a silicon nitride layer) may be formed on the substrate 101 to fill the first recess region R1, and then, the insulating layer may be anisotropically etched to form the insulating gapfill pattern 141 in the first recess region R1. Thereafter, the second spacer 123 and the third spacer 125 may be sequentially formed to cover the first spacer 121. As an example, the third spacer 125 may be formed of or include the same material as the first spacer 121, and the second spacer 123 may be formed of or include a material different from the first spacer 121. After the formation of the third spacer 125, the second impurity region 112b may be exposed.

Figure 8:
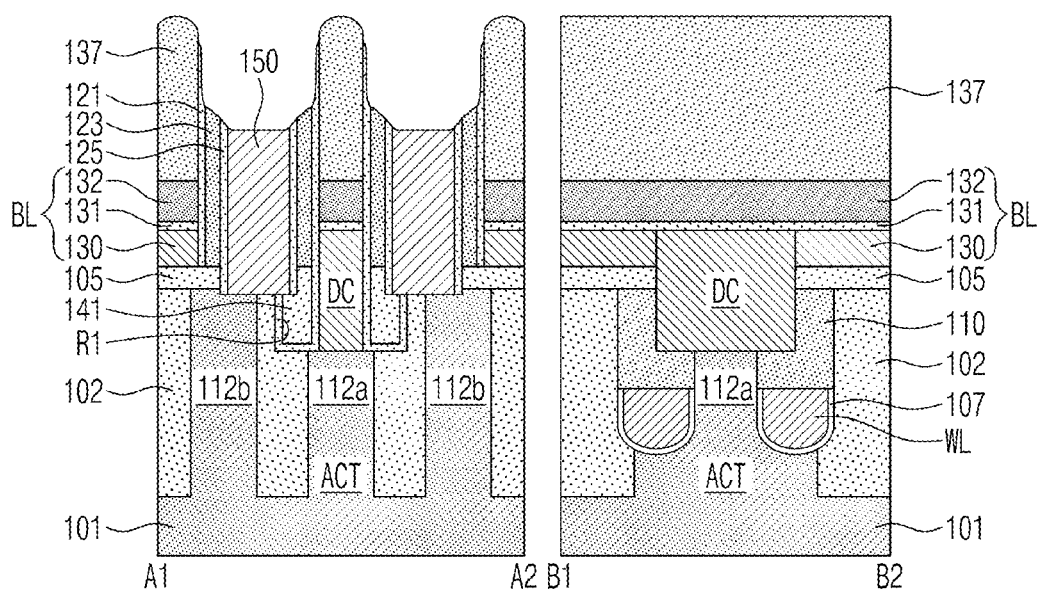

Referring to FIGS. 1 and 8, preliminary second contact plugs 150 may be formed between the bit lines BL. To form the preliminary second contact plugs 150 on the second impurity regions 112b, respectively, fence patterns may be formed between the second impurity regions 112b, before the formation of the preliminary second contact plugs 150. In other words, the preliminary second contact plugs 150 may be formed to fill spaces defined by the side surfaces of the bit lines BL and the side surfaces of the fence patterns. The formation of the preliminary second contact plugs 150 may include forming a layer containing doped or undoped polysilicon or a metallic material and performing an etch-back process. In an embodiment, upper portions of the first to third spacers 121, 123, and 125 may be removed during the etch-back process.

Figure 9:
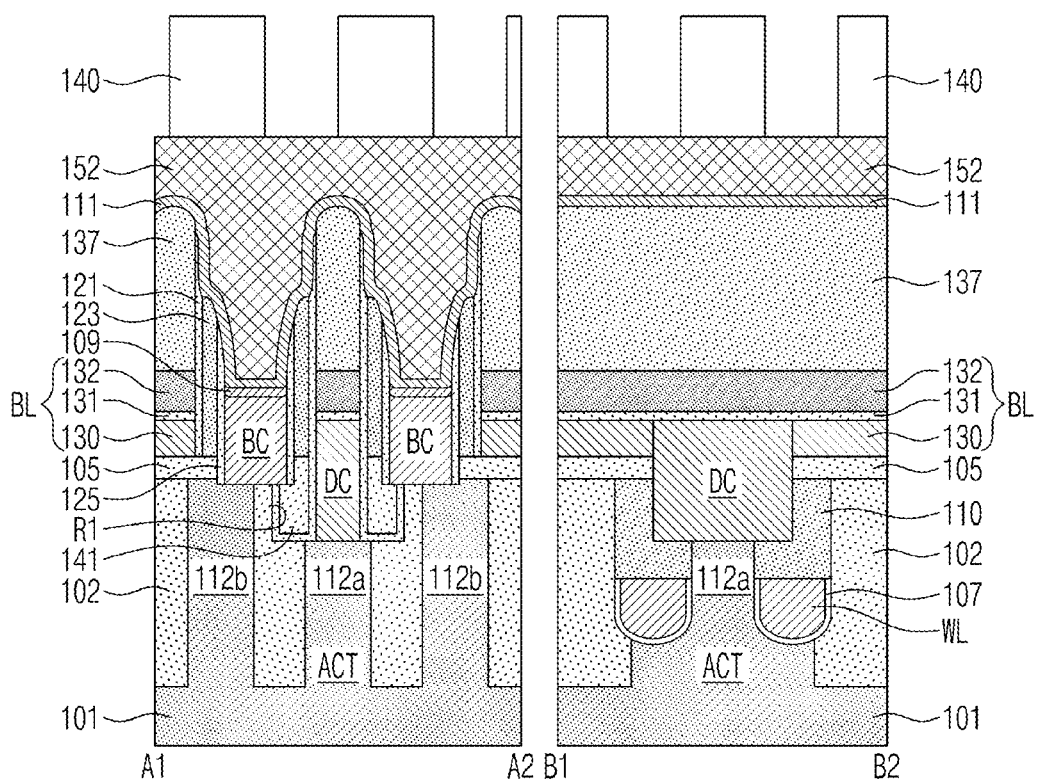

Referring to FIGS. 1 and 9, the second contact plugs BC may be formed by etching the preliminary second contact plugs 150. In an embodiment, the second contact plugs BC may have top surfaces that are located at the same level as the metal-containing pattern 132. The ohmic layer 109 may be formed on each of the second contact plugs BC. The ohmic layer 109 may be formed of or include at least one of metal silicides. In an embodiment, the ohmic layer 109 may be formed by depositing a metal layer on the top surfaces of the second contact plugs BC and performing a thermal treatment process.

A diffusion barrier layer 111 may be conformally formed on the substrate 101. A landing pad layer 152 may be formed on the diffusion barrier layer 111 to fill a space between the bit line capping patterns 137. The landing pad layer 152 may be, e.g., a tungsten layer. Third mask patterns 140 may be formed on the landing pad layer 152. For example, the third mask patterns 140 may be formed of or include at least one of amorphous carbon, silicon nitride, or metallic materials. The third mask patterns 140 may be used to delimit positions of the landing pads LP, which will be described below. The third mask patterns 140 may be formed to be vertically overlapped with the second contact plugs BC.

Figure 10:
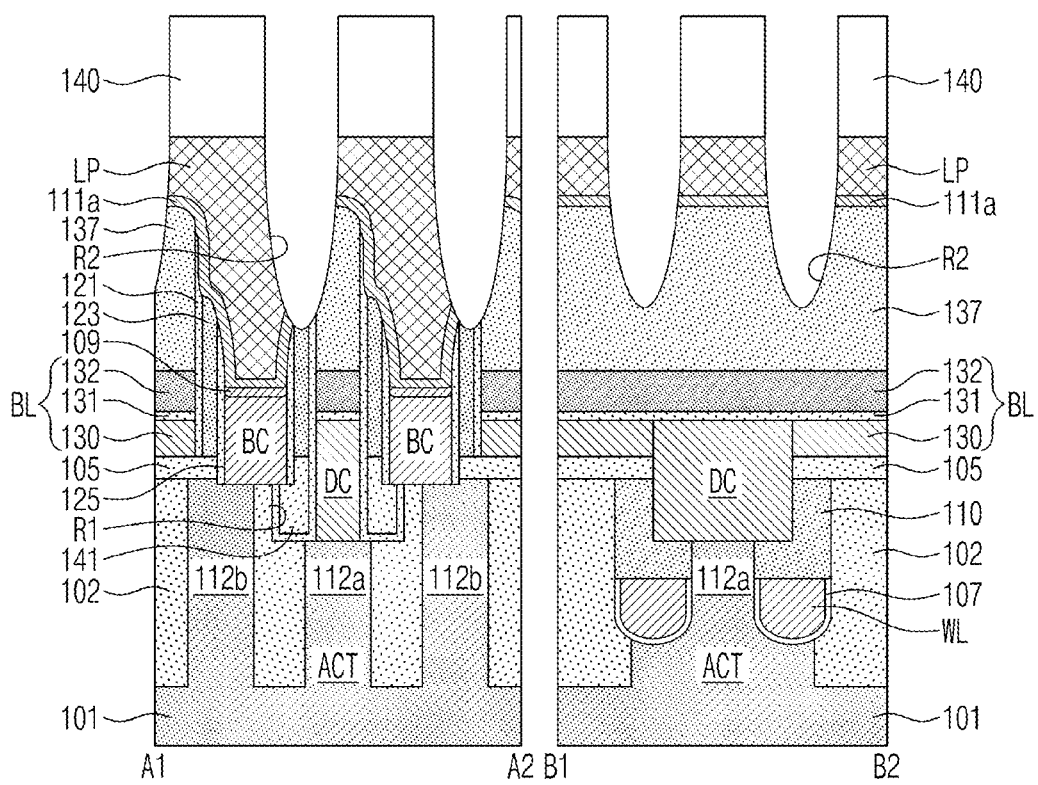

Referring to FIGS. 1 and 10, a portion of the landing pad layer 152 may be removed by performing an anisotropic etching process using the third mask patterns 140 as an etch mask. Accordingly, the landing pads LP, which are spaced apart from each other by the second recess region R2, may be formed. During the formation of the second recess region R2, the diffusion barrier layer 111 may be patterned to form the diffusion prevention patterns 111a which are spaced apart from each other. In addition, upper portions of the bit line capping patterns 137 and upper portions of the first to third spacers 121, 123, and 125 may also be removed, during the formation of the second recess region R2.

Figure 11:
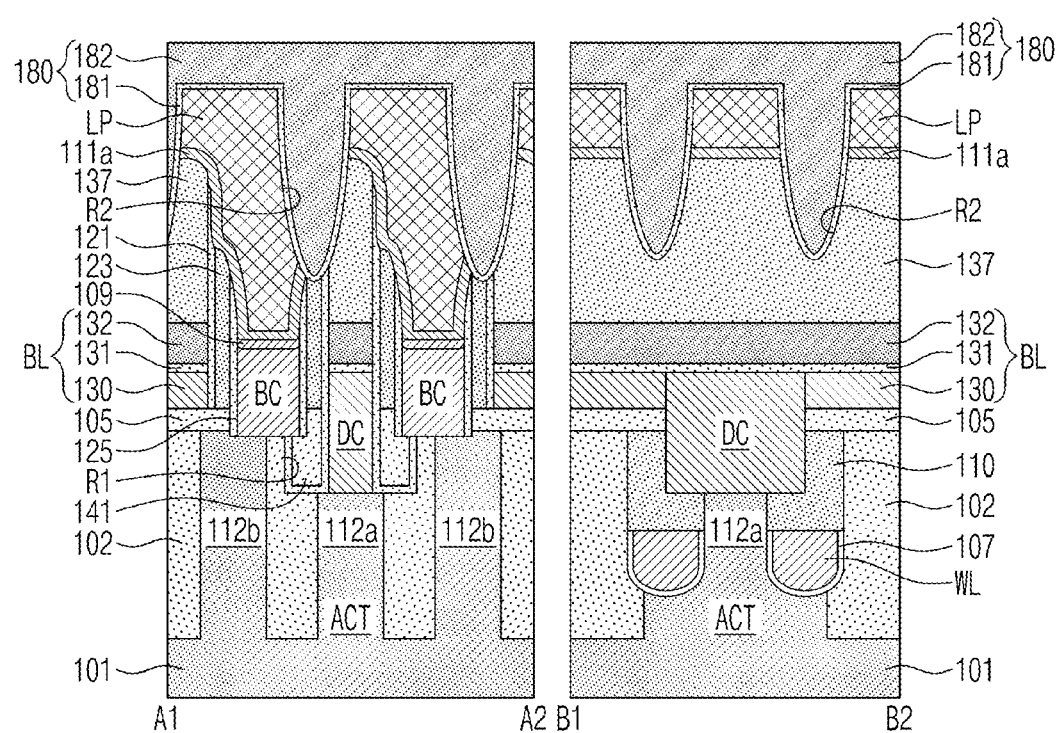

Referring to FIGS. 1 and 11, a first layer 180 may be formed to cover the second recess region R2, after the removal of the third mask patterns 140. In an embodiment, the first layer 180 may include the first and second insulating layers 181 and 182. As an example, the first insulating layer 181 may be formed of or include one of silicon nitride or silicon oxynitride, and the second insulating layer 182 may be formed of a material that is one of silicon nitride or silicon oxynitride but is different from that of the first insulating layer 181. Alternatively, both of the first and second insulating layers 181 and 182 may be formed of or include silicon nitride and may have different material properties from each other. In an embodiment, the first layer 180 may be a single layer.

Figure 12:
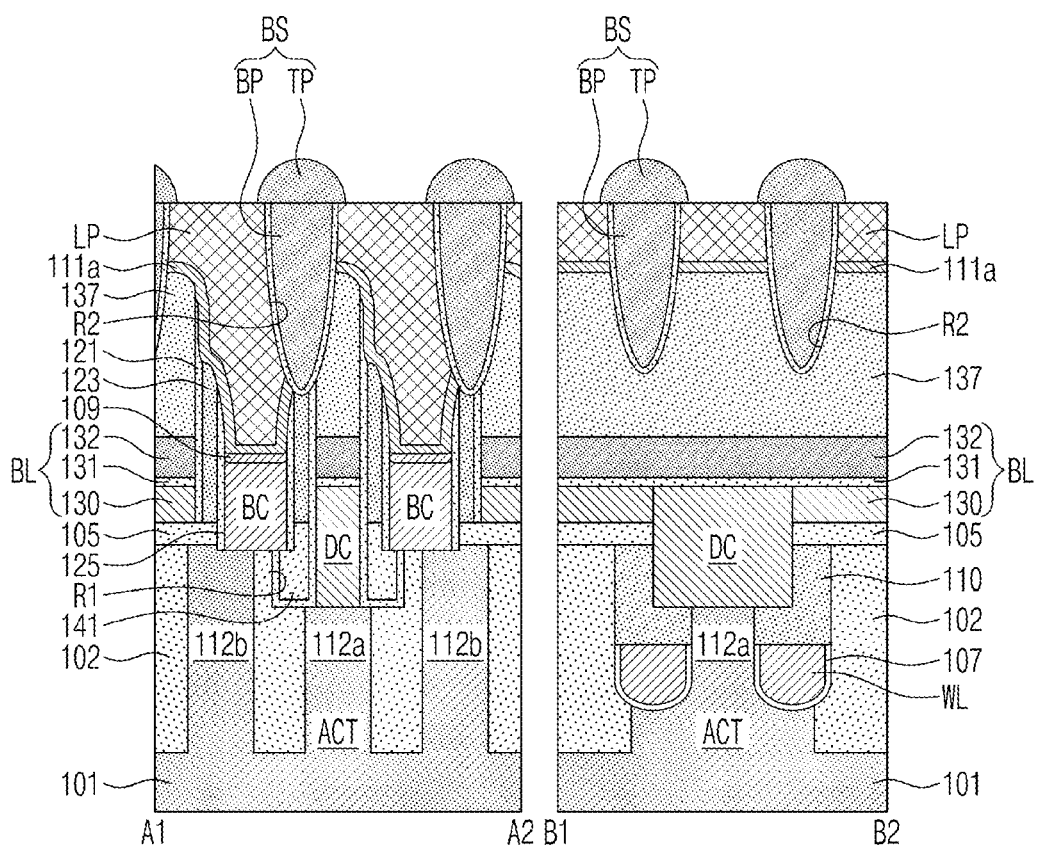

Referring to FIGS. 1 and 12, a planarization process may be performed to expose, e.g., the upper surfaces of, the landing pads LP. The planarization process may be a chemical mechanical polishing process or an etch-back process. As a result of the planarization process, the first portion BP of the gap-fill structure BS may be formed from the first layer 180, e.g., portions of the first layer 180 outside the second recess R2 may be removed to form the first portion BP that completely fills the second recess R2. A top surface of the first portion BP may be located at substantially the same level as top surfaces of the landing pads LP, e.g., top surfaces of the first portion BP and the landing pads LP may be coplanar.

The second portion TP of the gap-fill structure BS may be formed on the first portion BP. Accordingly, the gap-fill structure BS including the first and second portions BP and TP may be formed. The second portion TP may be formed by a selective deposition process and/or a selective growth process, in which the first portion BP is used as a seed layer. In other words, the second portion TP may be formed by a selective dielectric-on-dielectric deposition process. In an embodiment, the second portion TP may be formed by an atomic layer deposition (ALD) process. In an embodiment, the second portion TP of the gap-fill structure BS may be formed of or include at least one of silicon oxynitride, silicon carbon nitride, or silicon nitride. Since the second portion TP can be grown without spatial confinement caused by the landing pads LP, the growth process of the second portion TP may be performed in both of lateral and vertical directions, and thus, the second portion TP may be formed to have a semi-circular section and to cover a portion of a top surface of the landing pad LP adjacent thereto. Since the second portion TP of the gap-fill structure BS formed using the first portion BP as a seed layer, the second portion TP may be formed without an additional process for alignment with the first portion BP. For example, referring to FIG. 12, the second portion TP may completely cover, e.g., overlap, the top surface of the first portion BP, and may extend, e.g., radially, beyond the first portion BP, e.g., to overhang the first portion BP.

Figure 13:
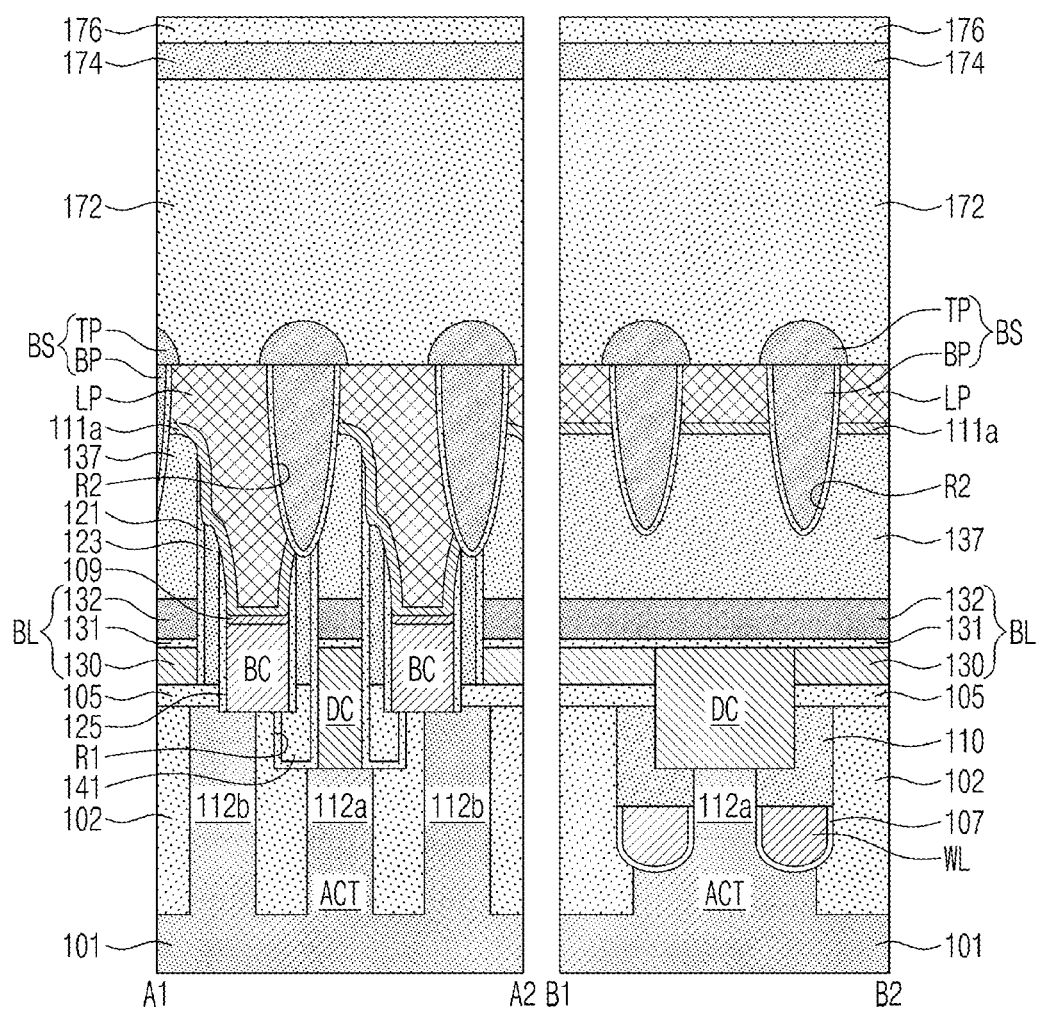

Referring to FIGS. 1 and 13, a first mold layer 172, a supporting layer 174, and a second mold layer 176 may be formed on the landing pads LP and the gap-fill structure BS. An etch stop layer may be formed before the formation of the first mold layer 172, as will be described with reference to FIG. 21, but an etch prevention layer may be omitted. The supporting layer 174 may be or include, e.g., a silicon nitride layer. The first and second mold layers 172 and 176 may be formed of or include a material having an etch selectivity with respect to the supporting layer 174. For example, the first and second mold layers 172 and 176 may be formed of or include silicon oxide.

Figure 14:
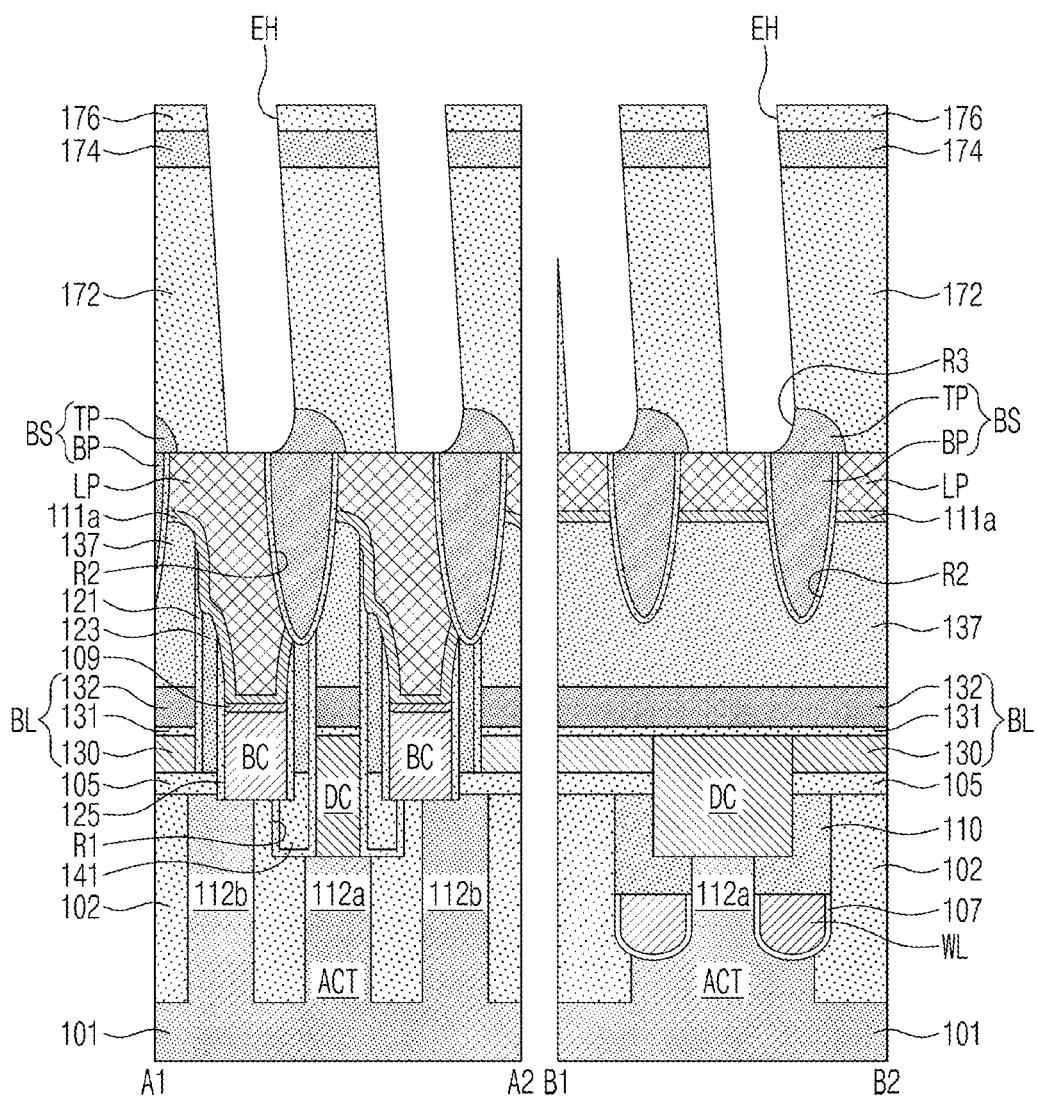

Referring to FIGS. 1 and 14, the electrode holes EH exposing the landing pads LP may be formed by sequentially patterning the second mold layer 176, the supporting layer 174, and the first mold layer 172. The electrode holes EH may be formed on the landing pads LP, respectively. The formation of the electrode holes EH may include performing an anisotropic etching process. Due to their relatively high aspect ratio, the electrode holes EH may be formed to have a center axis that is not perpendicular to the top surface of the substrate 101. Furthermore, due to misalignment in a process of forming the electrode holes EH, a lower portion of the electrode hole EH may be offset from a center of the top surface LT of the landing pad LP and may be partially overlapped with the gap-fill structure BS, as shown in FIG. 14. The shape of the electrode holes EH and the shape of the bottom electrodes BE, which will be formed in the electrode holes EH, are not limited to the illustrated shapes.

A portion of a lower side surface of the electrode hole EH may be defined by a side surface of the gap-fill structure BS (in particular, the second portion TP). In other words, during the formation of the electrode holes EH, the second portion TP of the gap-fill structure BS may be partially removed, and thus, the third recess regions R3 may be formed in the second portion TP of the gap-fill structure BS. The second portion TP of the gap-fill structure BS may have an etch resistance better than the first mold layer 172, under an etching condition for forming the electrode holes EH. As a result, the portion of the lower side surface of the electrode hole EH may have a convexly rounded shape, as shown in FIG. 14.

Figure 15:
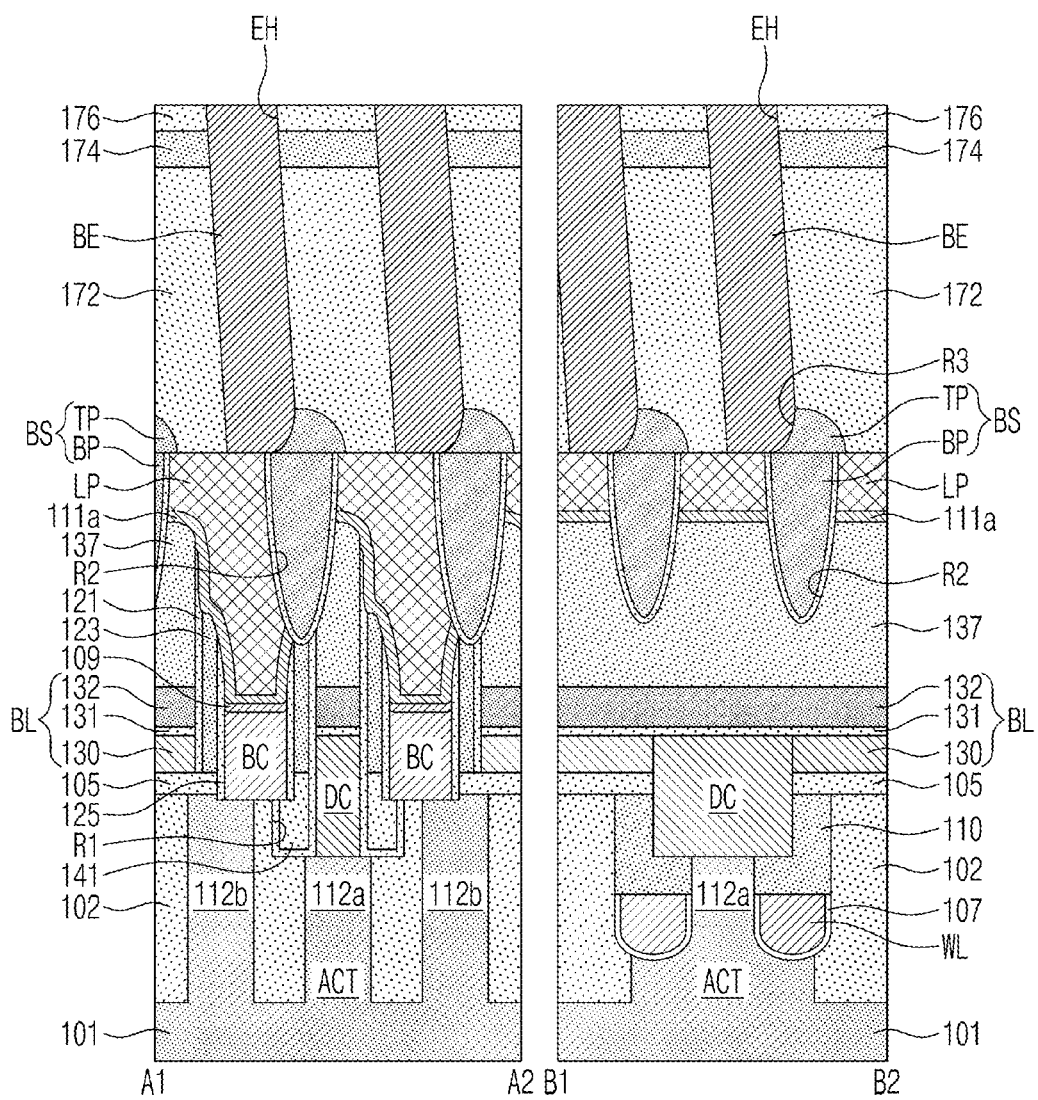

Referring to FIGS. 1 and 15, a conductive layer may be deposited to fill the electrode hole EH, and then an etch-back process or a chemical-mechanical polishing process may be performed to remove the conductive layer on the second mold layer 176 and to form the bottom electrode BE in the electrode hole EH. As an example, the bottom electrodes BE may be formed of or include at least one of doped poly-silicon, metal nitrides (e.g., titanium nitride), or metallic materials (e.g., tungsten, aluminum, and copper). A lower portion of the bottom electrode BE may fill the third recess region R3 and may be connected to the second portion TP of the gap-fill structure BS.

Figure 16:
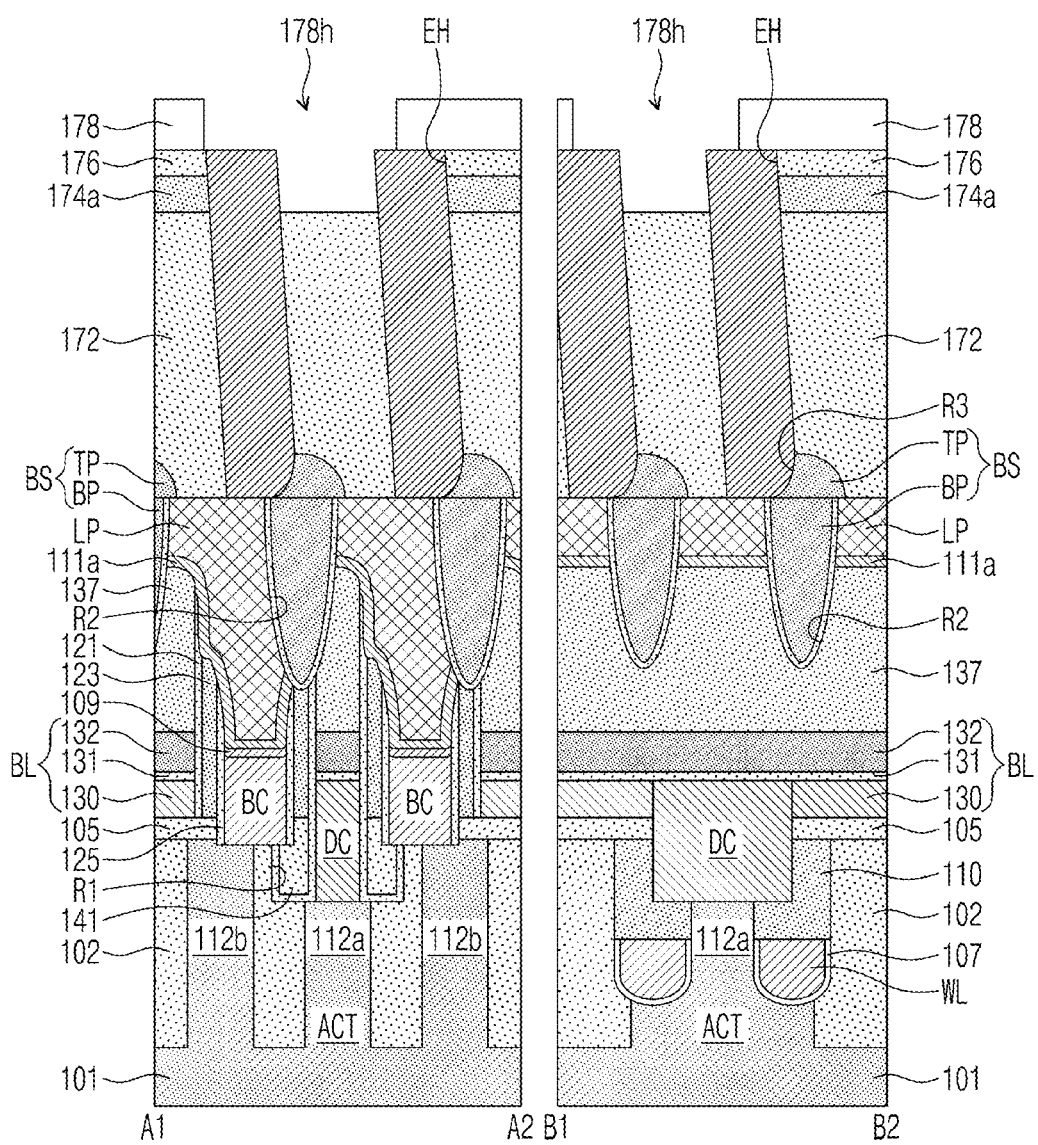

Referring to FIGS. 1 and 16, a third mask pattern 178 may be formed on the second mold layer 176. The third mask pattern 178 may have a plurality of openings 178*h*. Top surfaces of the bottom electrodes BE, which are adjacent to each other, and the second mold layer 176 between the bottom electrodes BE may be exposed through the opening 178*h*. An anisotropic etching process using the third mask pattern 178 as an etch mask may be performed to remove the second mold layer 176, which is exposed through the openings 178*h*, and the supporting layer 174 thereunder. Accordingly, a supporting pattern 174*a* may be formed, and the first mold layer 172 below the opening 178*h* may be exposed.

Figure 17:
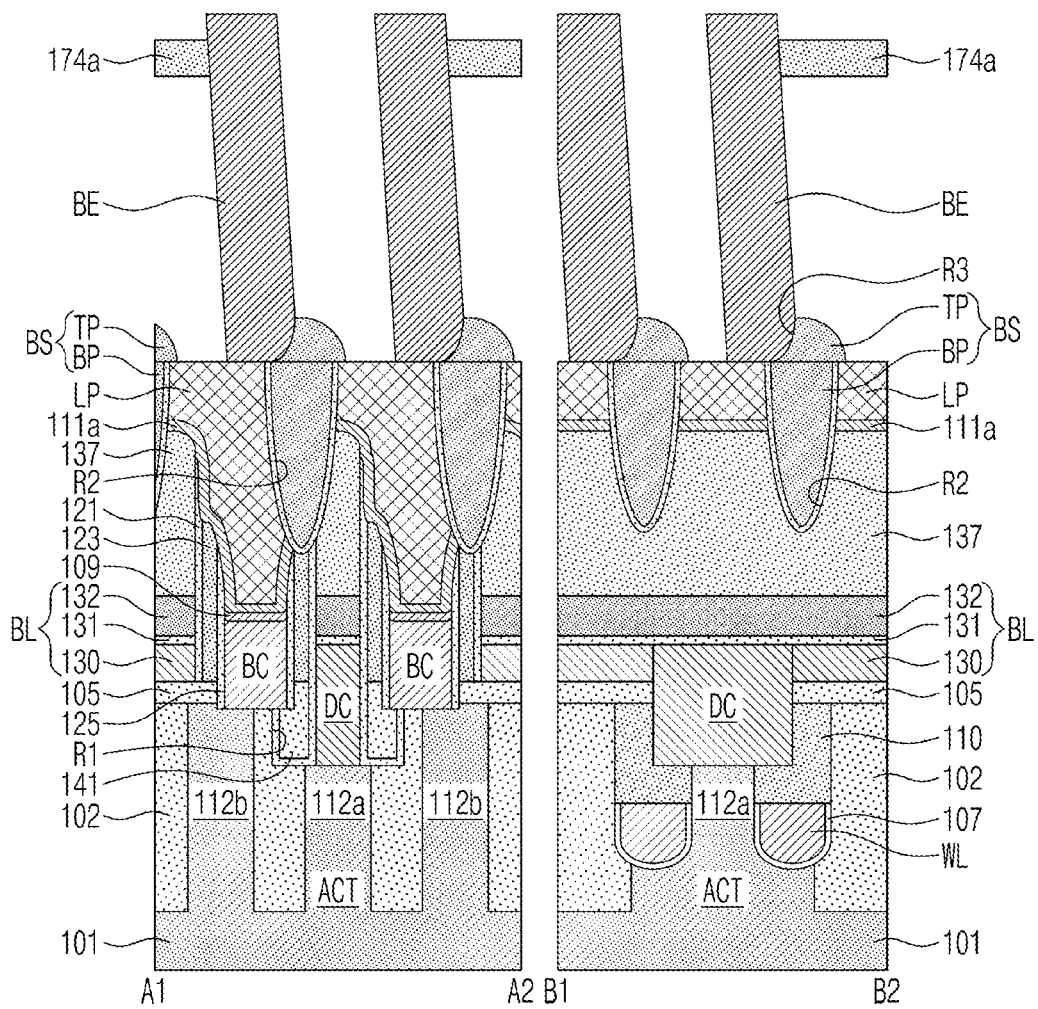

Referring to FIGS. 1 and 17, the third mask pattern 178 may be removed, and in this case, the second mold layer 176 may be exposed. An isotropic etching process may be performed to remove all of the first and second mold layers 172 and 176 and to expose the bottom electrode BE and the supporting pattern 174*a*. The top surfaces of the landing pads LP and the top surface of the gap-fill structure BS may also be exposed.

Referring back to FIGS. 1 and 2, the dielectric layer DL may be formed to cover the bottom electrode BE and the supporting pattern 174*a*. As an example, the dielectric layer DL may be formed by depositing zirconium oxide (e.g., ZrOx) or hafnium oxide (e.g., HfOx). The top electrode TE may be formed on the dielectric layer DL to cover the bottom electrodes BE. The top electrode TE may be formed of or include at least one of doped poly-silicon, doped silicon-germanium, metal nitrides (e.g., titanium nitride), or metallic materials (e.g., tungsten, aluminum, and copper). Accordingly, the capacitor CAP including the bottom electrode BE, the top electrode TE, and the dielectric layer DL may be formed.

Figure 18:
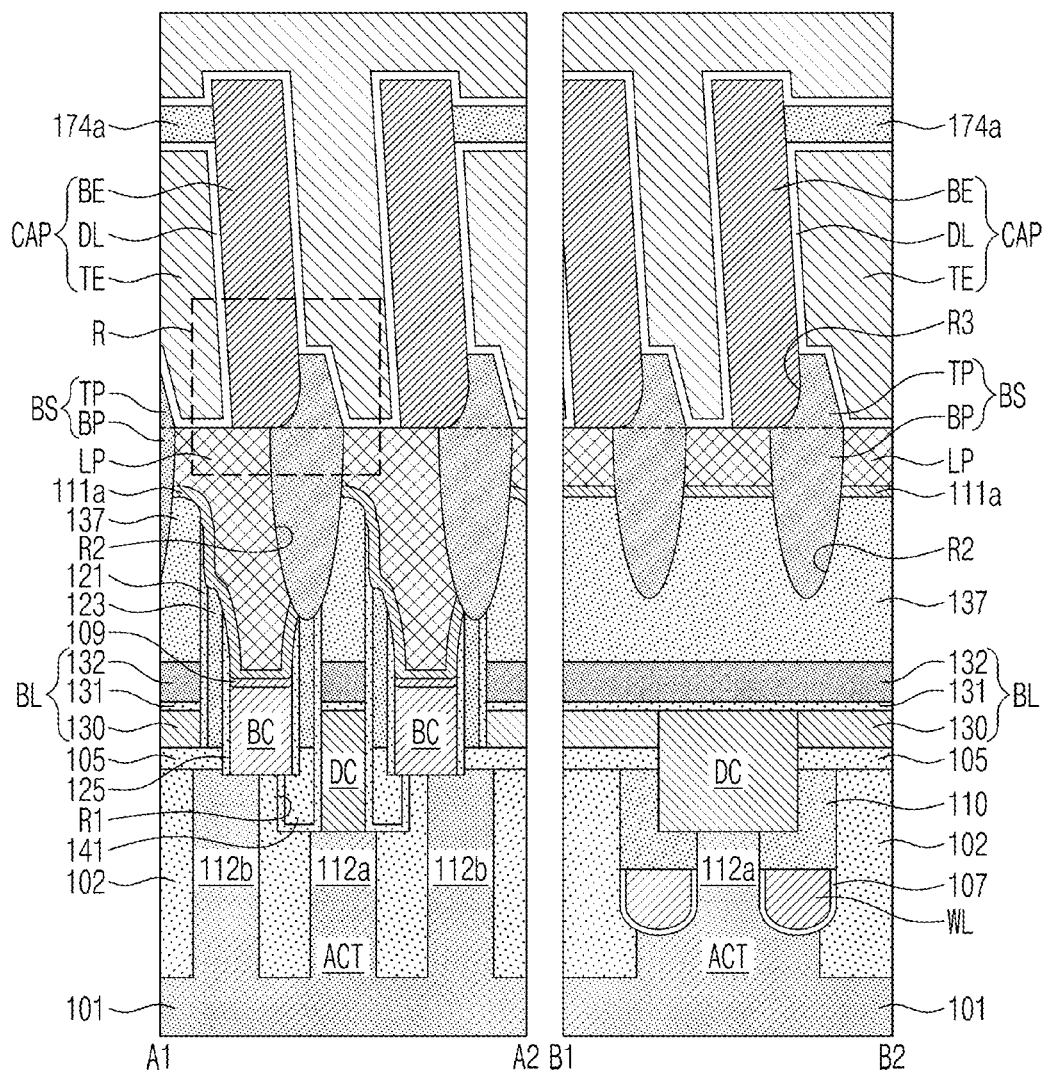
FIG. 18 is a cross-sectional view along lines A1-A2 and B1-B2 of FIG. 1 illustrating a semiconductor memory device according to an embodiment.
Figure 19:
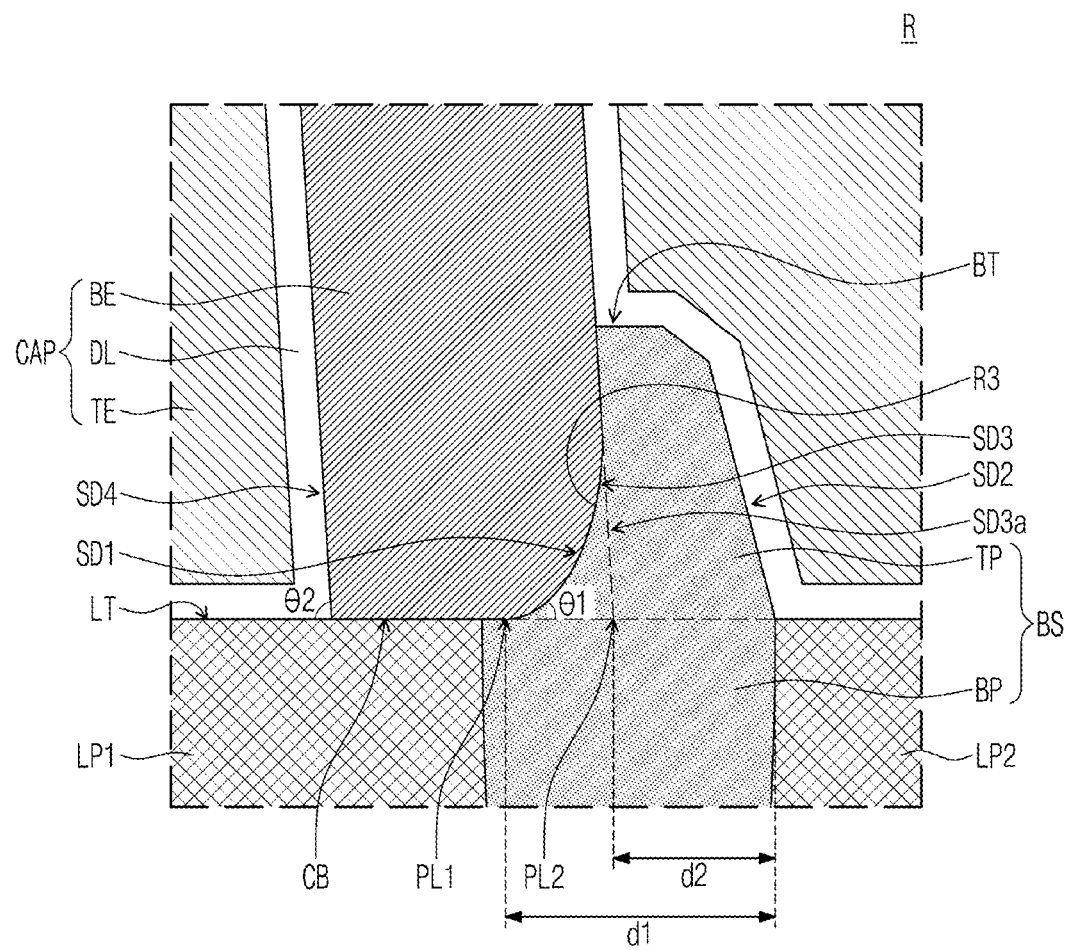
FIG. 19 is an enlarged cross-sectional view of portion 'R' of FIG. 18.

FIG. 18 is a cross-sectional view along lines A1-A2 and B1-B2 of FIG. 1 to illustrate a semiconductor memory device according to an embodiment. FIG. 19 is an enlarged cross-sectional view of portion 'R' of FIG. 18. For concise description, a previously described element may be identified by the same reference number without repeating a detailed overlapping description thereof.

Referring to FIGS. 1, 18, and 19, the gap-fill structure BS may be provided to fill a space between the landing pads LP. The gap-fill structure BS may be provided in the second recess region R2, which is defined by the side surfaces of the landing pads LP and the side surfaces of the bit line capping patterns 137. When viewed in a plan view, the gap-fill structure BS may have a shape filling the space between the landing pads LP, which are two-dimensionally spaced apart from each other. The top surfaces LT of the landing pads LP may be in contact with the bottom surfaces CB of the bottom electrodes BE, respectively.

The top surface BT of the gap-fill structure BS may be higher than the top surfaces LT of the landing pads LP. In an embodiment, the gap-fill structure BS may include the first portion BP, which is provided to fill a space between the landing pads LP, and the second portion TP, which protrudes from, e.g., above, the top surfaces LT of the landing pads LP in a direction opposite to the substrate 101. In the present embodiment, the first portion BP of the gap-fill structure BS may be a single insulating layer, unlike the embodiment of FIGS. 2 and 3. That is, the first portion BP may be one of the first and second insulating layers 181 and 182 in the embodiment of FIGS. 2 and 3. The first portion BP of the gap-fill structure BS in the embodiment of FIGS. 2 and 3 may also be changed to a single insulating layer including only one of the first and second insulating layers 181 and 182, like the present embodiment.

The second portion TP of the gap-fill structure BS may be formed of or include the same material as the first portion BP. The first and second portions BP and TP of the gap-fill structure BS may be formed together to form a single, e.g., integral and seamless, body structure, and in this case, there may be no interface between the first and second portions BP and TP.

In an embodiment, the first and second portions BP and TP of the gap-fill structure BS may be formed of or include at least one of silicon nitride, silicon oxynitride, and silicon carbon nitride. When measured in a direction perpendicular to the top surface of the substrate 101, a thickness of the second portion TP of the gap-fill structure BS may be smaller than a thickness of the first portion BP. As an example, the thickness of the second portion TP of the gap-fill structure BS may be larger than about 50% of the thickness of the first portion BP and may be smaller than 100% of the thickness of the first portion BP. The upper width of the first portion BP of the gap-fill structure BS may be substantially equal to the lower width of the second portion TP.

Unlike that in the embodiment of FIGS. 2 and 3, the second portion TP of the gap-fill structure BS may be deposited along with the first portion BP and then may be formed by patterning the deposited layer. Accordingly, the top surface BT of the gap-fill structure BS may be flat, compared with that in the embodiment of FIGS. 2 and 3. The structures and shapes of other elements, except for the second portion TP, may be substantially the same as those in the embodiment of FIGS. 2 and 3.

FIGS. 20 to 24 are cross-sectional views along lines A1-A2 and B1-B2 of FIG. 1 of stages in a method of fabricating a semiconductor memory device according to an embodiment. For concise description, a previously described element may be identified by the same reference number without repeating in detail an overlapping description thereof.

Figure 20:
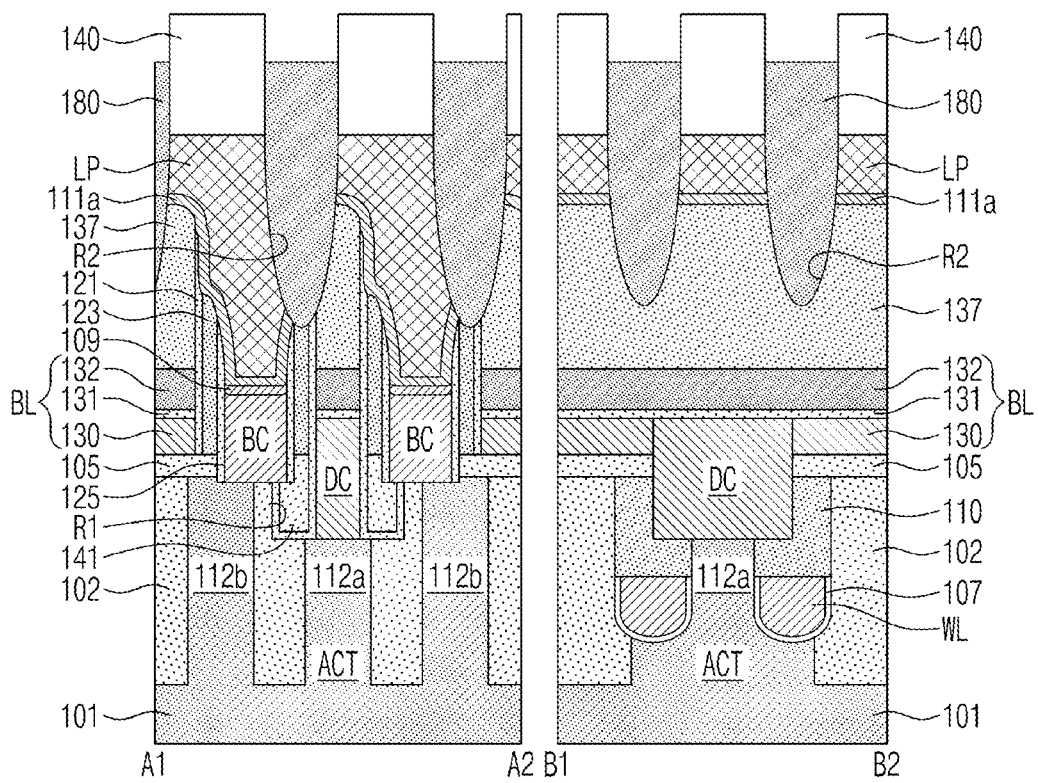
FIGS. 20 to 24 are cross-sectional views along lines A1-A2 and B1-B2 of FIG. 1 illustrating stages in a method of fabricating a semiconductor memory device according to an embodiment.

Referring to FIGS. 1 and 20, the first layer 180 may be formed to fill the second recess region R2, which has the same structure as that described with reference to FIG. 10. As an example, the first layer 180 may be one of a silicon nitride layer or a silicon oxynitride layer. The first layer 180 may be formed by depositing an insulating layer and performing an etch-back process until a top surface of the insulating layer is lowered to a level lower than top surfaces of the third mask patterns 140. The first layer 180 may be formed to have a top surface that is higher than the top surfaces of the landing pads LP. As an example, the first layer 180 may be formed by a low-temperature deposition process that is performed at a temperature of about 150° C. or lower.

Figure 21:
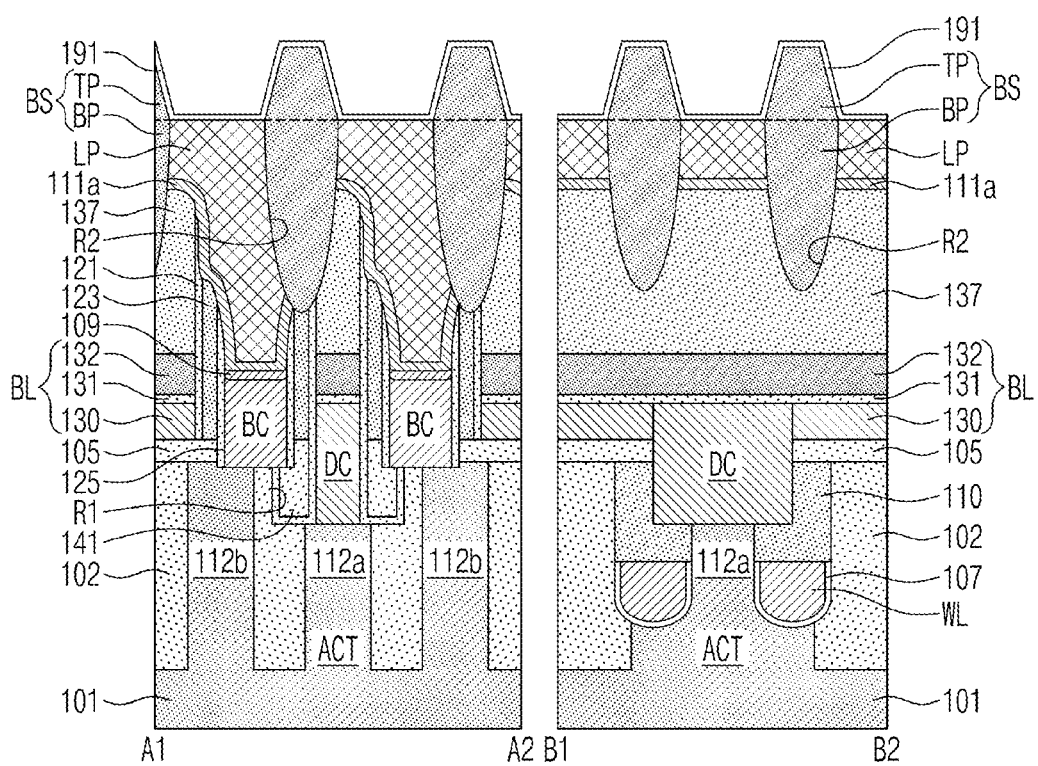

Referring to FIGS. 1 and 21, the third mask patterns 140 may be removed. During the removal of the third mask patterns 140, the first layer 180 may also be partially removed. As a result, the gap-fill structure BS including the first and second portions BP and TP may be formed from the first layer 180. A portion of the first layer 180 may also be removed during the removal of the third mask patterns 140, and in this case, the second portion TP may be formed to have a shape whose width decreases in an upward direction away from the first portion BP. Since the first and second portions BP and TP of the gap-fill structure BS are formed from the same layer, the second portion TP may be formed without an additional process for alignment with the first portion BP. The second portion TP of the gap-fill structure BS may be formed without additional depositing and patterning processes, because it is formed using the third mask patterns 140 as a mold.

An etch stop layer 191 may be formed to conformally cover the landing pads LP and the gap-fill structure BS. The etch stop layer 191 may be formed of or include a material that has an etch selectivity with respect to the first and second mold layers 172 and 176 to be described below. As an example, the etch stop layer 191 may be formed of or include at least one of doped or undoped amorphous silicon, doped poly silicon, or silicon nitride. As another embodiment, the etch stop layer 191 may be omitted. In the embodiment of FIG. 13, the etch stop layer 191 may be formed before the formation of the first mold layer 172.

Figure 22:
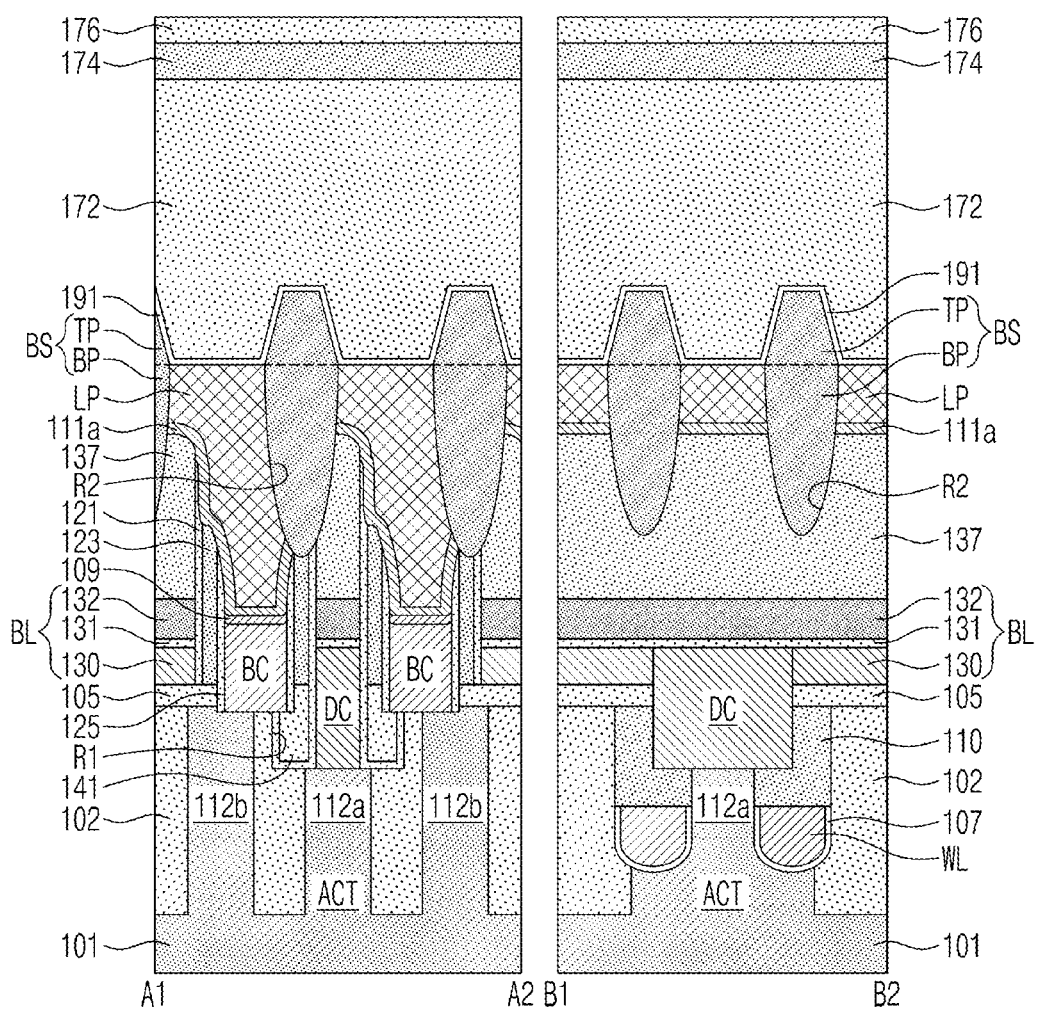

Referring to FIGS. 1 and 22, the first mold layer 172, the supporting layer 174, and the second mold layer 176 may be sequentially formed on the etch stop layer 191. The supporting layer 174 may be formed of or include, e.g., silicon nitride. The first and second mold layers 172 and 176 may be formed of or include a material having an etch selectivity with respect to the supporting layer 174. For example, the first and second mold layers 172 and 176 may be formed of or include silicon oxide.

Figure 23:
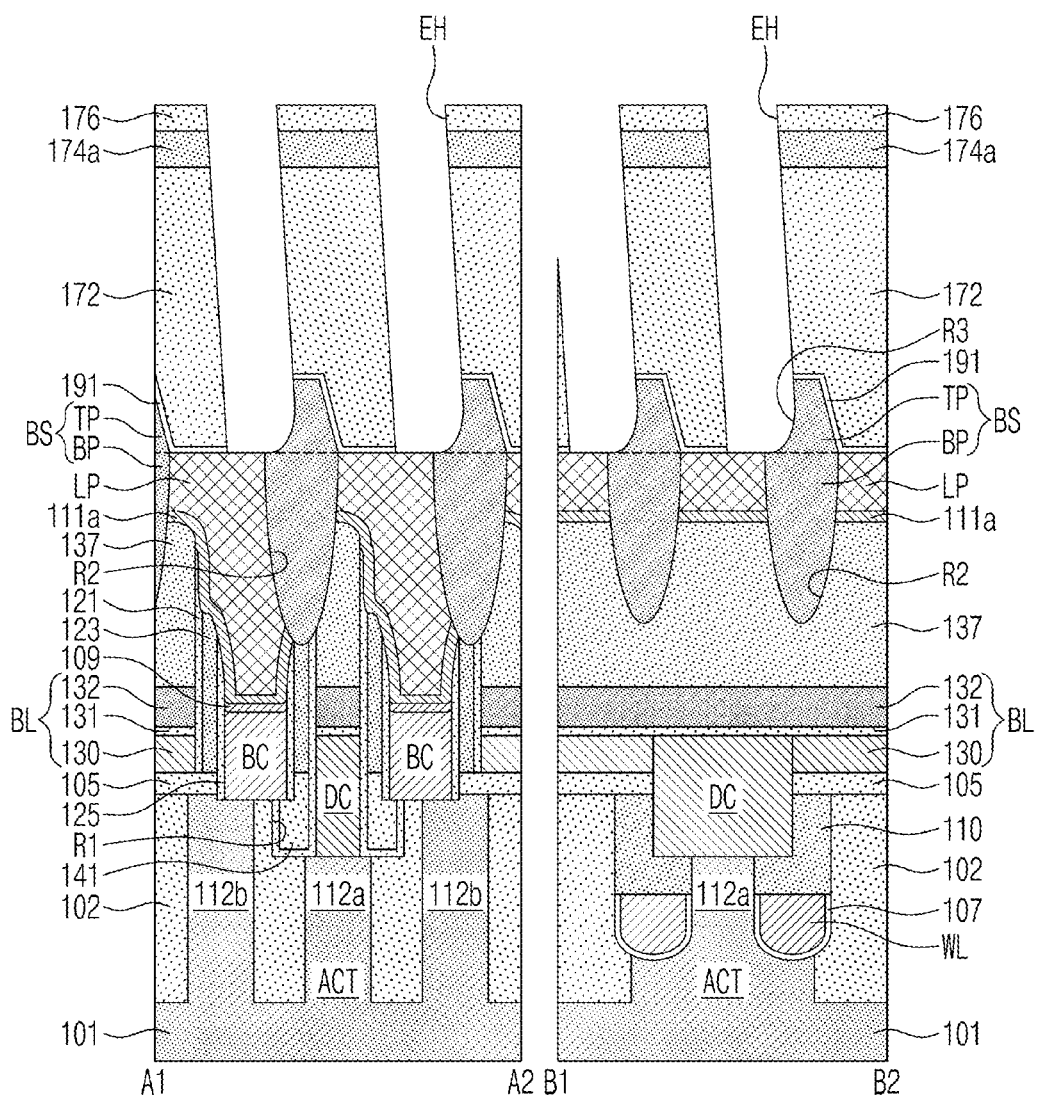

Referring to FIGS. 1 and 23, the electrode holes EH exposing the landing pads LP may be formed by sequentially patterning the second mold layer 176, the supporting layer 174, and the first mold layer 172. The process of forming the electrode holes EH may include a plurality of etching processes. As an example, the process of forming the electrode holes EH may include a first etching process, which is performed to expose the etch stop layer 191, and a second etching process, which is performed to expose the landing pads LP.

A portion of a lower side surface of the electrode hole EH may be defined by the gap-fill structure BS (in particular, by the side surface of the second portion TP of the gap-fill structure BS and the side surface of the etch stop layer 191). In other words, a portion of the second portion TP of the gap-fill structure BS and a portion of the etch stop layer 191 may be removed, during the formation of the electrode holes EH, and as a result, the third recess regions R3 may be formed in the second portion TP of the gap-fill structure BS.

Figure 24:
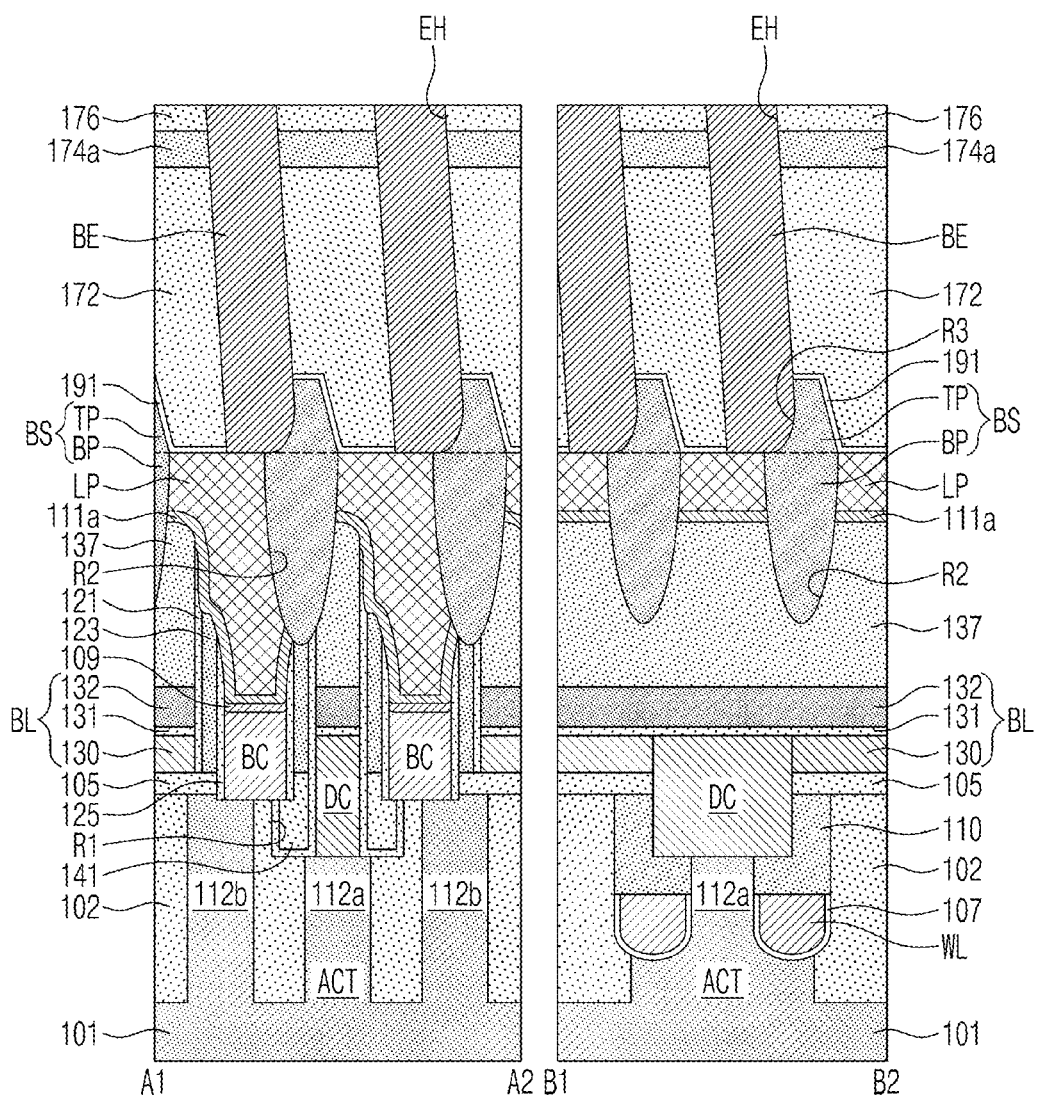

Referring to FIGS. 1 and 24, a conductive layer may be deposited to fill the electrode hole EH, and an etch-back process or a chemical-mechanical polishing process may be performed to remove the conductive layer on the second mold layer 176 and to form the bottom electrodes BE on the electrode hole EH. As an example, the bottom electrode BE may be formed of or include at least one of doped polysilicon, metal nitrides (e.g., titanium nitride), or metallic materials (e.g., tungsten, aluminum, and copper). A lower portion of the bottom electrode BE may be provided to fill the third recess region R3 and may be connected to the second portion TP of the gap-fill structure BS and the etch stop layer 191.

Referring back to FIGS. 1 and 18, the capacitor CAP including the bottom electrode BE, the top electrode TE, and the dielectric layer DL may be formed through the process described with reference to FIGS. 16, 17, and 2.

By way of summation and review, as design rule of a semiconductor memory device (e.g., a dynamic random-access memory (DRAM) device) decreases, a difference between the largest and smallest values of electrostatic capacitance is being increased due to potential oxidation of a bottom electrode of a capacitor. Thus, there is an increasing demand for a semiconductor memory device, which is configured to improve the difference in the electrostatic capacitance, and a method of fabricating the same.

Therefore, an embodiment provides a semiconductor memory device, which is configured to prevent a bottom electrode from being unintentionally connected to a landing pad adjacent thereto, e.g., to prevent or substantially minimize parasitic current and/or a bridge between the bottom electrode and the adjacent landing pad, and a method of fabricating the same, e.g., via selective deposition or amorphous carbon layer (ACL) mask used to form a barrier layer. Further, it may be possible to reduce a leakage current of a semiconductor memory device and to improve reliability of the semiconductor memory device. An embodiment also provides a highly-reliable semiconductor memory device and a method of fabricating the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
    active regions including first impurity regions and second impurity regions;
    word lines on the active regions and extended in a first direction;
    bit lines on the word lines and extended in a second direction crossing the first direction, the bit lines being connected to the first impurity regions;
    first contact plugs between the bit lines, the first contact plugs being connected to the second impurity regions;
    landing pads on the first contact plugs, respectively; and
    gap-fill structures filling spaces between the landing pads, top surfaces of the gap-fill structures being higher than top surfaces of the landing pads,
    wherein each of the gap-fill structures includes:
        a first portion between the landing pads; and
        a second portion protruding above the top surfaces of the landing pads, an upper width of the second portion being smaller than a lower width of the second portion, and
    wherein a first side surface of the second portion includes a concavely shaped region and a second side surface of the second portion includes a convexly shaped region.

2. The semiconductor memory device as claimed in claim 1, further comprising bottom electrodes on the landing pads, respectively, at least one of the bottom electrodes being in contact with a side surface of the second portion of a corresponding one of the gap-fill structures.

3. The semiconductor memory device as claimed in claim 2, wherein:
    first side surfaces of lower portions of the bottom electrodes, which are in contact with side surfaces of corresponding second portions of the gap-fill structures, have a first inclination angle with respect to the top surfaces of the landing pads,
    second side surfaces of the lower portions of the bottom electrodes, which are not in contact with the side surface of the corresponding second portions of the gap-fill structures, have a second inclination angle with respect to the top surfaces of the landing pads, and
    the first inclination angle is smaller than the second inclination angle.

4. The semiconductor memory device as claimed in claim 1, wherein the first portion includes a first insulating layer and a second insulating layer on the first insulating layer.

5. The semiconductor memory device as claimed in claim 4, wherein the second portion does not include the second insulating layer.

6. The semiconductor memory device as claimed in claim 1, wherein a lower width of the second portion is larger than an upper width of the first portion.

7. The semiconductor memory device as claimed in claim 1, wherein the second portion is extended to overlap a top surface of an adjacent one of the landing pads.

8. The semiconductor memory device as claimed in claim 1, wherein the second portion has a higher density than the first portion.

9. The semiconductor memory device as claimed in claim 1, wherein the second portion and the first portion include the same material, and there is no interface between the second portion and the first portion.

10. The semiconductor memory device as claimed in claim 1, wherein a lower width of the second portion is equal to an upper width of the first portion.

11. A semiconductor memory device, comprising:
active regions including first impurity regions and second impurity regions;
word lines on the active regions and extended in a first direction;
bit lines on the word lines and extended in a second direction crossing the first direction, the bit lines being connected to the first impurity regions;
first contact plugs between the bit lines, the first contact plugs being connected to the second impurity regions;
landing pads on the first contact plugs; and
gap-fill structures filling spaces between the landing pads, each of the gap-fill structures including:
a first portion between the landing pads, the first portion having a decreasing width in a downward direction, and
a second portion protruding above top surfaces of the landing pads, the second portion having a decreasing width in an upward direction,
wherein a first side surface of the second portion includes a concavely shaped region and a second side surface of the second portion includes a convexly shaped region.

12. The semiconductor memory device as claimed in claim 11, further comprising bottom electrodes on the landing pads, respectively, and a lower portion of at least one of the bottom electrodes being in contact with the first side surface of the second portion.

13. The semiconductor memory device as claimed in claim 11, wherein a lower width of the second portion is larger than an upper width of the first portion.

14. The semiconductor memory device as claimed in claim 11, wherein the second portion is extended to overlap a top surface of an adjacent one of the landing pads.

15. The semiconductor memory device as claimed in claim 11, wherein the second portion and the first portion include the same material, and there is no interface between the second portion and the first portion.

16. A semiconductor memory device, comprising:
a substrate;
word lines buried in an upper portion of the substrate, the word lines extended in a first direction;
active regions defined in the upper portion of the substrate by a device isolation layer, the active regions including first impurity regions and second impurity regions, which are spaced apart from each other with the word lines interposed therebetween;
bit lines on the substrate and extended in a second direction crossing the first direction, the bit lines being connected to the first impurity regions, and each of the bit lines including a semiconductor pattern, an ohmic pattern, and a metal-containing pattern;
first contact plugs connected to the second impurity regions;
second contact plugs connecting the first impurity regions to the bit lines;
landing pads on the first contact plugs;
a gap-fill structure filling a space between the landing pads, a top surface of the gap-fill structure being higher than top surfaces of the landing pads; and
a capacitor connected to the second impurity regions through the first contact plugs and the landing pads, the capacitor including bottom electrodes, a dielectric layer, and a top electrode,
wherein the gap-fill structure includes:
a first portion between the landing pads, and
a second portion protruding above the top surfaces of the landing pads, and
wherein a first side surface of the second portion includes a concavely shaped region and a second side surface of the second portion includes a convexly shaped region.

17. The semiconductor memory device as claimed in claim 16, wherein the second portion extends to overlap a top surface of an adjacent one of the landing pads.

18. The semiconductor memory device as claimed in claim 1, wherein the first side surface is directly connected to the second side surface.

19. The semiconductor memory device as claimed in claim 11, wherein the first side surface is directly connected to the second side surface.

20. The semiconductor memory device as claimed in claim 16, wherein the first side surface is directly connected to the second side surface.

* * * * *